(12) United States Patent
Kurokawa

(10) Patent No.: US 8,630,130 B2
(45) Date of Patent: Jan. 14, 2014

(54) MEMORY CIRCUIT, MEMORY UNIT, AND SIGNAL PROCESSING CIRCUIT

(75) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/429,574

(22) Filed: Mar. 26, 2012

(65) Prior Publication Data

US 2012/0250407 A1  Oct. 4, 2012

(30) Foreign Application Priority Data

Mar. 31, 2011  (JP) ................................ 2011-077380

(51) Int. Cl.
*G11C 7/10* (2006.01)

(52) U.S. Cl.
USPC .......... 365/189.05; 365/189.011; 365/189.03; 365/189.08; 365/193; 365/227; 365/228

(58) Field of Classification Search
USPC .......... 365/189.011, 189.03, 189.05, 189.08, 365/193, 227, 228
See application file for complete search history.

(56) References Cited

U.S. PATENT DOCUMENTS

| | | | |
|---|---|---|---|
| 4,656,607 A | 4/1987 | Hagiwara et al. | |
| 4,797,576 A | 1/1989 | Asazawa | |
| 4,809,225 A | 2/1989 | Dimmler et al. | |
| 5,473,571 A * | 12/1995 | Shigematsu et al. | .......... 365/227 |
| 5,731,856 A | 3/1998 | Kim et al. | |
| 5,744,864 A | 4/1998 | Cillessen et al. | |
| 5,936,879 A | 8/1999 | Brouwer et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |

(Continued)

FOREIGN PATENT DOCUMENTS

| | | |
|---|---|---|
| EP | 0 135 036 A2 | 3/1985 |
| EP | 0 297 777 A2 | 1/1989 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

(Continued)

*Primary Examiner* — Viet Q Nguyen
(74) *Attorney, Agent, or Firm* — Fish & Richardson P.C.

(57) ABSTRACT

A memory circuit includes a transistor having a channel in an oxide semiconductor layer, a capacitor, a first arithmetic circuit, a second arithmetic circuit, a third arithmetic circuit, and a switch. An output terminal of the first arithmetic circuit is electrically connected to an input terminal of the second arithmetic circuit. The input terminal of the second arithmetic circuit is electrically connected to an output terminal of the third arithmetic circuit via the switch. An output terminal of the second arithmetic circuit is electrically connected to an input terminal of the first arithmetic circuit. An input terminal of the first arithmetic circuit is electrically connected to one of a source and a drain of the transistor. The other of the source and the drain of the transistor is electrically connected to one of a pair of electrodes of the capacitor and to an input terminal of the third arithmetic circuit.

14 Claims, 11 Drawing Sheets

(56) References Cited

U.S. PATENT DOCUMENTS

| | | |
|---|---|---|
| 6,576,943 B1 | 6/2003 | Ishii et al. |
| 6,727,522 B1 | 4/2004 | Kawasaki et al. |
| 6,738,281 B2 | 5/2004 | Yokozeki |
| 6,788,567 B2 * | 9/2004 | Fujimori ............... 365/154 |
| 6,809,952 B2 | 10/2004 | Masui |
| 6,845,032 B2 | 1/2005 | Toyoda et al. |
| 6,876,023 B2 | 4/2005 | Ishii et al. |
| 6,944,045 B2 * | 9/2005 | Fujimori ............... 365/145 |
| 6,972,986 B2 | 12/2005 | Peng et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,471,580 B2 * | 12/2008 | Henzler et al. ............ 365/207 |
| 7,501,293 B2 | 3/2009 | Ito et al. |
| 7,616,040 B2 | 11/2009 | Motomura |
| 7,674,650 B2 | 3/2010 | Akimoto et al. |
| 7,732,819 B2 | 6/2010 | Akimoto et al. |
| 7,847,287 B2 | 12/2010 | Kim et al. |
| 7,863,611 B2 | 1/2011 | Abe et al. |
| 7,940,085 B2 | 5/2011 | Kim et al. |
| 8,085,076 B2 | 12/2011 | Djaja et al. |
| 8,158,987 B2 | 4/2012 | Nabekura et al. |
| 8,212,248 B2 | 7/2012 | Itagaki et al. |
| 8,217,680 B2 | 7/2012 | Kim et al. |
| 8,314,637 B2 | 11/2012 | Kato et al. |
| 8,362,538 B2 * | 1/2013 | Koyama et al. ............ 257/298 |
| 8,368,066 B2 | 2/2013 | Yamazaki et al. |
| 8,410,838 B2 * | 4/2013 | Kato et al. ............... 327/215 |
| 8,432,187 B2 | 4/2013 | Kato et al. |
| 8,446,171 B2 * | 5/2013 | Takahashi ............... 326/46 |
| 2001/0046027 A1 | 11/2001 | Tai et al. |
| 2002/0056838 A1 | 5/2002 | Ogawa |
| 2002/0074568 A1 | 6/2002 | Yoshida et al. |
| 2002/0132454 A1 | 9/2002 | Ohtsu et al. |
| 2003/0122581 A1 | 7/2003 | Inoue et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0071039 A1 | 4/2004 | Fujimori |
| 2004/0127038 A1 | 7/2004 | Carcia et al. |
| 2004/0164778 A1 | 8/2004 | Toyoda et al. |
| 2005/0017302 A1 | 1/2005 | Hoffman |
| 2005/0169039 A1 | 8/2005 | Peng et al. |
| 2005/0169040 A1 | 8/2005 | Peng et al. |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0095975 A1 | 5/2006 | Yamada et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0019460 A1 | 1/2007 | Kang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126666 A1 | 6/2007 | Yamazaki et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0197414 A1 | 8/2008 | Hoffman et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2009/0002044 A1 | 1/2009 | Kobayashi |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0019839 A1 | 1/2010 | Monden |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0010493 A1 | 1/2011 | Kimura et al. |
| 2011/0024741 A1 | 2/2011 | Abe et al. |
| 2011/0089417 A1 | 4/2011 | Yamazaki et al. |
| 2011/0101351 A1 | 5/2011 | Yamazaki |
| 2011/0121878 A1 | 5/2011 | Kato et al. |
| 2011/0148463 A1 | 6/2011 | Kato et al. |
| 2011/0176357 A1 | 7/2011 | Koyama et al. |
| 2011/0187410 A1 | 8/2011 | Kato et al. |
| 2013/0057315 A1 | 3/2013 | Kato et al. |
| 2013/0127497 A1 | 5/2013 | Koyama |

FOREIGN PATENT DOCUMENTS

| | | |
|---|---|---|
| EP | 0 530 928 A2 | 3/1993 |
| EP | 0 818 891 A2 | 1/1998 |
| EP | 1 447 909 A1 | 8/2004 |
| EP | 1 583 239 A2 | 10/2005 |

(56) References Cited

FOREIGN PATENT DOCUMENTS

| | | |
|---|---|---|
| EP | 1 737 044 A1 | 12/2006 |
| EP | 2 226 847 A2 | 9/2010 |
| JP | 60-025269 A | 2/1985 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-066899 A | 3/1989 |
| JP | 03-192915 A | 8/1991 |
| JP | 05-110392 A | 4/1993 |
| JP | 05-251705 A | 9/1993 |
| JP | 07-147530 A | 6/1995 |
| JP | 08-264794 A | 10/1996 |
| JP | 10-078836 A | 3/1998 |
| JP | 10-093423 A | 4/1998 |
| JP | 11-505377 A | 5/1999 |
| JP | 2000-044236 A | 2/2000 |
| JP | 2000-077982 A | 3/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-269616 A | 9/2005 |
| JP | 2005-323295 A | 11/2005 |
| JP | 2006-050208 A | 2/2006 |
| JP | 2006-165532 A | 6/2006 |
| JP | 2007-096055 A | 4/2007 |
| JP | 2007-123861 A | 5/2007 |
| JP | 2007-125823 A | 5/2007 |
| JP | 2007-179021 A | 7/2007 |
| JP | 2008-147903 A | 6/2008 |
| JP | 2009-164393 A | 7/2009 |
| JP | 2009-206942 A | 9/2009 |
| JP | 2009-212443 A | 9/2009 |
| JP | 2010-034710 A | 2/2010 |
| WO | 03/044953 A1 | 5/2003 |
| WO | 2004/059838 A1 | 7/2004 |
| WO | 2004/114391 A1 | 12/2004 |
| WO | 2009/087943 A1 | 7/2009 |
| WO | 2009/110623 A1 | 9/2009 |

OTHER PUBLICATIONS

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Toshio Kamiya et al.; Carrier Transport Properties and Electronic Structures of Amorphous Oxide Semiconductors: The present status; 2009; pp. 621-633; Kotai Butsuri, Japan.

Toshio Kamiya et al.; Carrier Transport Properties and Electronic Structures of Amorphous Oxide Semiconductors: The present status; 2009; vol. 44; No. 9; pp. 621-633; Kotai Butsuri, Japan (with full English translation).

Shunpei Yamazaki et al.; "Research, Development, and Application of Crystalline Oxide Semiconductor"; SID Digest '12 : SID International Symposium Digest of Technical Papers; 2012; pp. 183-186.

Tatsuji Nishijima et al.; "Low-power Display System Driven by Utilizing Technique Using Crystalline IGZO Transistor"; SID Digest '12 : SID International Symposium Digest of Technical Papers; 2012; pp. 583-586.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

(56) References Cited

OTHER PUBLICATIONS

Jeon, S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid.State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M. "Suftla flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energectics in ZnO: A hybrid Hartee-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-

(56) References Cited

OTHER PUBLICATIONS

OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

\* cited by examiner

MEMORY CIRCUIT, MEMORY UNIT, AND SIGNAL PROCESSING CIRCUIT

BACKGROUND OF THE INVENTION

1. Field of the Invention

The present invention relates to a memory circuit in which the logic state is not erased after the power is turned off, to a memory unit and a signal processing circuit using the memory circuit, to a method for driving the memory circuit, the memory unit, and the signal processing circuit, and to an electronic device using the signal processing circuit.

2. Description of the Related Art

Signal processing circuits such as central processing units (CPUs) vary in structure depending on the intended use. A signal processing circuit generally has a main memory for storing data or program and other memory units such as a register and a cache memory. A register has a function of temporarily holding data for carrying out arithmetic processing, holding a program execution state, or the like. Meanwhile, a cache memory, which is located between an arithmetic circuit and a main memory, is provided to reduce low-speed access to the main memory and speed up the arithmetic processing.

In a memory unit, such as a register or a cache memory, data writing needs to be performed at higher speed than in a main memory. For this reason, in general, a flip-flop circuit or the like is used as a register, while a static random access memory (SRAM) or the like is used as a cache memory. In other words, such a register, a cache memory, or the like is a volatile memory unit which loses data after the supply of power is stopped.

In order to achieve low power consumption, a method in which the supply of the supply voltage to a signal processing circuit is temporarily stopped while input/output of data is not conducted has been suggested. In the method, a nonvolatile memory unit is located in the periphery of a volatile memory unit such as a register or a cache memory, and the data is temporarily stored in the nonvolatile memory unit. Thus, the register, the cache memory, or the like in the signal processing circuit holds data even while the supply of the supply voltage is stopped (see Patent Document 1, for example).

In the case where the supply of the supply voltage to a signal processing circuit is stopped for a long time, data in a volatile memory unit is transferred to an external memory unit such as a hard disk or a flash memory before the supply of the supply voltage is stopped, so that the data can be prevented from being lost.

REFERENCE

Patent Document

[Patent Document 1] Japanese Published Patent Application No. H10-078836

SUMMARY OF THE INVENTION

In the method in which data in a volatile memory unit is transferred to and stored in a nonvolatile memory unit located in the periphery of the volatile memory unit while the supply of the supply voltage is stopped, a memory circuit in the nonvolatile memory unit uses a magnetic element or a ferroelectric element in many cases. A memory circuit using a ferroelectric element has a limited number of rewriting operations because it poses a problem, for example, of write error due to ferroelectric material fatigue caused after the repetition of data writing.

In the case where a flash memory is used as the nonvolatile memory unit, each memory circuit involves electron-injection or electron-emission operation using a tunnel current caused by application of a high voltage. This causes a problem, for example, of significant degradation of each memory circuit due to the repetition of data rewriting. This limits the number of rewriting operations.

With a method in which data in the volatile memory unit is transferred to and stored in the external memory unit while the supply of the supply voltage is stopped, it takes a long time for returning the data from the external memory unit to the volatile memory unit. Therefore, backing up data to the external memory unit is not suitable for the case where the supply of the supply voltage is frequently stopped for low power consumption.

In view of the foregoing problems, an object is to provide a memory circuit with a novel structure which can hold data after the supply of the supply voltage is stopped and to provide a method for driving the memory circuit.

Another object is to provide a signal processing circuit whose power consumption can be reduced and to provide a method for driving the signal processing circuit. The object is to provide particularly a signal processing circuit whose power consumption can be reduced by stopping the supply of the supply voltage and to provide a method for driving the signal processing circuit.

The following describes one embodiment of a memory circuit according to the present invention.

(Structure of Memory Circuit)

The memory circuit includes a transistor whose off-state current is extremely low, a capacitor, a first arithmetic circuit, a second arithmetic circuit, a third arithmetic circuit, and a switch. An output terminal of the first arithmetic circuit is electrically connected to an input terminal of the second arithmetic circuit. The input terminal of the second arithmetic circuit is electrically connected to an output terminal of the third arithmetic circuit via the switch. An output terminal of the second arithmetic circuit is electrically connected to an input terminal of the first arithmetic circuit. The input terminal of the first arithmetic circuit is electrically connected to one of a source and a drain of the transistor. The other of the source and the drain of the transistor is electrically connected to one of a pair of electrodes of the capacitor and to an input terminal of the third arithmetic circuit.

Here, the transistor whose off-state current is extremely low may be a transistor whose channel is formed in a layer or substrate composed of a semiconductor whose band gap is wider than that of silicon. Examples of semiconductors whose band gap is wider than that of silicon include compound semiconductors, e.g., oxide semiconductors and nitride semiconductors. The transistor whose off-state current is extremely low may be, for example, a transistor whose channel is formed in an oxide semiconductor layer.

In "Structure of Memory Circuit", the first arithmetic circuit may be, for example, an inverter, a three-state buffer, a clocked inverter, a NAND circuit, or a NOR circuit. The second arithmetic circuit may be, for example, an inverter, a three-state buffer, a clocked inverter, a NAND circuit, or a NOR circuit. The third arithmetic circuit may be, for example, an inverter, a three-state buffer, a clocked inverter, a NAND circuit, or a NOR circuit. The switch may be, for example, an analog switch or a transistor.

Note that the switch can be omitted by using a circuit having a switching function as the third arithmetic circuit.

The switch can be omitted, for example, by using a three-state buffer or clocked inverter as the third arithmetic circuit.

In "Structure of Memory Circuit", in the case where the first arithmetic circuit, the second arithmetic circuit, the third arithmetic circuit, and the switch include transistors, the transistors may be transistors whose channel is formed in a layer or substrate composed of a semiconductor other than an oxide semiconductor. For example, the transistors may be transistors whose channel is formed in a silicon layer or a silicon substrate.

In "Structure of Memory Circuit", the transistor whose off-state current is extremely low may be a transistor having two gates above and below a layer in which a channel is formed (active layer). One of the gates can receive a control signal, while the other can receive another control signal. The other control signal may be a signal with a fixed potential. The fixed potential may be either a low supply potential or a high supply potential. Note that the two gates may be electrically connected to each other and receive the control signal. A signal input to the other gate can control the threshold voltage or the like of the transistor, further reduce the off-state current of the transistor, and increase the on-state current of the transistor.

In "Structure of Memory Circuit", the other of the pair of electrodes of the capacitor may receive a fixed potential, e.g., a low supply potential.

In "Structure of Memory Circuit", while supply voltage is supplied, the first arithmetic circuit and the second arithmetic circuit form a feedback loop and data can be held with this feedback loop. Examples of circuits that include the first arithmetic circuit and the second arithmetic circuit and hold data with a feedback loop include flip-flop circuits. Circuits that hold data using a feedback loop, such as flip-flop circuits, can input and output data in synchronism with a clock signal and the inverted signal of the clock signal. Here, flip-flop circuits include latch circuits. For example, flip-flop circuits include level sensitive latch circuits and edge sensitive latch circuits. One embodiment of the memory circuit according to the present invention is a circuit that holds data using a feedback loop, such as a flip-flop circuit, and has the following additional components: a transistor whose off-state current is extremely low, a capacitor, an arithmetic circuit (the third arithmetic circuit), and a switch. Therefore, "Structure of Memory Circuit" can be expressed as follows.

The memory circuit includes a flip-flop circuit, a transistor whose off-state current is extremely low, a capacitor, an arithmetic circuit, and a switch. The flip-flop circuit includes a first node and a second node. While a supply voltage is supplied, a signal at the second node is the inverted signal of a signal at the first node. One of a source and a drain of the transistor is electrically connected to the first node. The other of the source and the drain of the transistor is electrically connected to one of the pair of electrodes of the capacitor and to the input terminal of the arithmetic circuit. The output terminal of the arithmetic circuit is electrically connected to the second node via the switch.

(Method for Driving Memory Circuit)

The following describes one embodiment of a method for driving the memory circuit. In the case of the memory circuit, the following driving method can be used in order that, after the supply of the supply voltage is started, the supply of the supply voltage can be stopped to reduce power consumption and then started again.

(Operation during Supply of Supply Voltage)

A supply voltage is supplied to the memory circuit and the clock signal and the inverted signal of the clock signal are signals whose levels (potentials) periodically change between high and low levels. At this time, in synchronism with the clock signal and the inverted signal of the clock signal, the feedback loop composed of the first arithmetic circuit and the second arithmetic circuit holds a signal corresponding to data (and its inverted signal). Here, the switch is in the off state. Thus, the memory circuit holds input data in the feedback loop, and outputs the data held in the feedback loop. Here, the transistor whose channel is formed in an oxide semiconductor layer has a lower mobility than a transistor whose channel is formed in a silicon layer or a silicon substrate. The presence of a transistor having a low mobility in a feedback loop decreases the data writing and reading speed of the feedback loop. In one embodiment of the memory circuit according to the present invention, a transistor having a low mobility, e.g., a transistor whose channel is formed in an oxide semiconductor layer is not present in the feedback loop. Thus, the feedback loop achieves high-speed data writing and reading, increasing the data writing and reading speed (operation speed) of the memory circuit. Note that, here, the transistor whose off-state current is extremely low is preferably in the off state. If the transistor whose off-state current is extremely low is always in the on state, a signal potential corresponding to the data is input to the capacitor when data is written or read to/from the feedback loop, decreasing the data writing and reading speed of the feedback loop.

(Operation before Supply of Supply Voltage)

Before the supply of the supply voltage to the memory circuit is stopped, the levels (potentials) of the clock signal and the inverted signal of the clock signal are fixed. In other words, the levels (potentials) of the clock signal and the inverted signal of the clock signal remain unchanged since given data is held in the feedback loop. This means that a period during which the levels (potentials) of the clock signal and the inverted signal of the clock signal, which normally change between high and low levels periodically, do not change is provided. Here, a period during which the level (potential) of the clock signal and the inverted signal of the clock signal is fixed is also called "clock signal fixed period". Further, in the clock signal fixed period, the transistor whose off-state current is extremely low is switched to the off state. For example, if the transistor whose off-state current is extremely low is in the on state immediately before the clock signal fixed period, the transistor whose off-state current is extremely low is switched to the off state in the clock signal fixed period. In contrast, for example, if the transistor whose off-state current is extremely low is in the off state immediately before the clock signal fixed period, the transistor whose off-state current is extremely low is temporarily switched to the on state, and then switched to the off state in the clock signal fixed period. In this way, a signal (potential) corresponding to data in the feedback loop is transferred to and held in the capacitor. Note that the switch remains in the off state.

As described above, by switching the transistor whose off-state current is extremely low to the off state while the levels of the clock signal and the inverted signal of the clock signal are fixed, a signal (potential) corresponding to data in the feedback loop can be transferred to and held in the capacitor while fluctuations of a signal (potential) corresponding to the data are suppressed.

(Operation for Stopping Supply of Supply Voltage)

After "Operation before Supply of Supply Voltage", the supply of the supply voltage to the memory circuit is stopped. Moreover, after "Operation before Supply of Supply Voltage", the supply of the clock signal and the inverted signal of the clock signal can be stopped. By stopping the supply of the clock signal and the inverted signal of the clock signal as well as the supply of the supply voltage, power for supplying the clock signal and the inverted signal of the clock signal can also be reduced. Note that the switch remains in the off state.

Here, the transistor whose off-state current is extremely low remains in the off state. Consequently, a signal (potential) corresponding to data that has been held in the feedback loop is held in the capacitor even after the supply of the supply voltage to the memory circuit is stopped. In this way, the use of the transistor whose off-state current is extremely low allows a signal (potential) in the capacitor to be held for a long period of time, so that the memory circuit can hold data for a long period of time after the supply of the supply voltage is stopped.

Note that, in one embodiment of the memory circuit according to the present intention, while the transistor whose off-state current is extremely low and the switch are in the off state, one of the pair of electrodes of the capacitor is electrically disconnected from each node in the feedback loop. Therefore, while the transistor whose off-state current is extremely low and the switch are in the off state, the supply of the supply voltage to the memory circuit and the supply of the clock signal and the inverted signal of the clock signal can be stopped at the same time, or one of these supplies can be stopped after the other is stopped. In other words, the supply of the supply voltage can be stopped in a flexible sequence.

(Operation for Restarting Supply of Supply Voltage)

The supply of the supply voltage to the memory circuit is restarted. In addition, the clock signal and the inverted signal of the clock signal returned and fixed to the levels (potentials) at which they had been while the supply of the supply voltage had been stopped are supplied. Thus, a clock signal fixed period is started. Here, if the transistor whose off-state current is extremely low and the switch are in the off state, the supply of the supply voltage to the memory circuit and the supply of the clock signal and the inverted signal of the clock signal returned and fixed to the levels (potentials) at which they had been while the supply of the supply voltage had been stopped can be restarted at the same time, or one of these supplies can be restarted after the other is restarted. In other words, the supply of the supply voltage can be restarted in a flexible sequence.

Then, the switch is switched to the on state. Note that the transistor whose off-state current is extremely low remains in the off state. The signal (potential) held in the capacitor is converted into a corresponding signal by the third arithmetic circuit, and then, once the switch is switched to the on state, input to a predetermined node in the feedback loop. In this way, the data that has been held before the supply of the supply voltage is stopped is held in the feedback loop again. After the switch is switched to the off state again, fixing of the level (potential) of the clock signal and the inverted signal of the clock signal is stopped. In other words, the clock signal and the inverted signal of the clock signal are returned to the normal state where their levels (potentials) periodically change between high and low levels. In this way, in the memory circuit, the feedback loop can restart data writing and reading. The subsequent operation is similar to "Operation during Supply of Supply Voltage".

As described above, a path for transferring and writing data held in the feedback loop to the capacitor (hereinafter also called data saving path) and a path for returning the data held in the capacitor to the feedback loop (hereinafter also called data returning path) are separate. The use of an element with high mobility as the switch placed on the data returning path enables "Operation for Restarting Supply of Supply Voltage" to be conducted at higher speed.

The foregoing has described the method for driving the memory circuit.

(Memory Unit and Signal Processing Circuit)

One embodiment of a memory unit according to the present invention may be a memory unit using one or more memory circuits described above. One embodiment of a signal processing circuit according to the present invention may be a signal processing circuit using the memory unit. For example, the above-described memory circuit can be used in a memory unit such as a register or cache memory included in the signal processing circuit.

Further, the signal processing circuit may include, as well as the memory unit, any logic circuit such as an arithmetic circuit which transmits and receives data to/from the memory unit. In addition, the supply of the supply voltage to the memory unit and the supply of the supply voltage to the arithmetic circuit which transmits and receives data to/from the memory unit may be stopped at the same time.

One embodiment of the signal processing circuit according to the present invention may include a CPU, a memory, and a peripheral control unit for controlling access between the memory and the CPU. The CPU, the memory, and the peripheral control unit may include the above-described memory circuit. Further, the supply of the supply voltage may be stopped in the entire signal processing circuit including the CPU, the memory, and the peripheral control unit.

While a supply voltage is supplied to the memory circuit and the clock signal and the inverted signal of the clock signal whose levels (potentials) periodically change between high and low levels are input, the memory circuit holds input data in the feedback loop, and outputs the data held in the feedback loop. Here, a transistor having a low mobility, e.g., a transistor whose channel is formed in an oxide semiconductor layer is not present in the feedback loop. Thus, the feedback loop achieves high-speed data writing and reading, increasing the data writing and reading speed (operation speed) of the memory circuit.

The memory circuit can hold stored content (data) for a long period of time even while the supply of the supply voltage is stopped. Therefore, the fatigue of the memory circuit 100 due to the repetition of data rewriting can be made insignificant, increasing the number of possible data rewriting operations.

In addition, a path for writing data held in the feedback loop into the capacitor (data saving path) and a path for returning the data held in the capacitor to the feedback loop (data returning path) are separate. Here, a transistor whose off-state current is extremely low needs to be placed on the data saving path to hold the potential of one of the pair of electrodes of the capacitor even after the supply of the supply voltage is stopped. A transistor whose channel is formed in an oxide semiconductor layer has lower mobility than a transistor whose channel is formed in a silicon layer or a silicon substrate. However, since the data returning path is provided in addition to the data saving path, the use of an element with high mobility as the switch placed on the data returning path enables an operation after the restart of the supply of the supply voltage to be conducted at higher speed.

The use of this memory circuit for the signal processing circuit prevents data from being lost by stopping the supply of the supply voltage and allows the signal processing circuit to return, in a short time after the supply of the supply voltage is restarted, to the same state as before the supply of the supply voltage is stopped. This enables the use of a normally-off driving method in which the supply voltage is supplied only when necessary, thereby dramatically reducing power consumption. Moreover, the operation speed of the signal processing circuit can be increased, which increases reliability.

DETAILED DESCRIPTION OF THE INVENTION

Figure 1A:
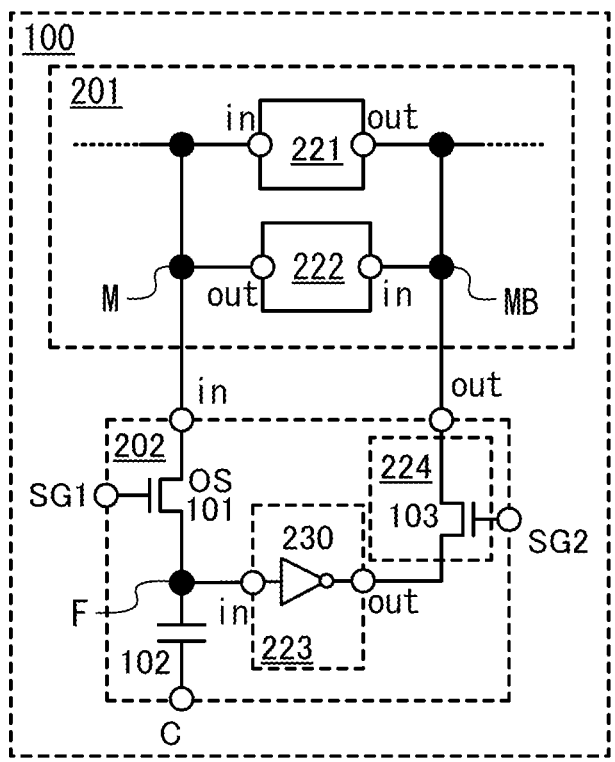
FIGS. 1A and 1B are circuit diagrams of a memory circuit.

Embodiments of the present invention will be described below with reference to the accompanying drawings. It will be readily appreciated by those skilled in the art that modes and details of the present invention can be modified in various ways without departing from the spirit and scope of the present invention. The present invention therefore should not be construed as being limited to the following description of the embodiments.

Note that the functions of the "source" and "drain" may replace each other in the case, for example, where transistors of different conductivity types are used, or where the direction of a current flow changes in a circuit operation. Therefore, the terms "source" and "drain" can replace each other in this specification.

The meaning of "electrically connected" includes "electrically connected through an object having any electric function". The "object having any electric function" may be any object which allows electric signals to be transmitted and received between the components connected through the object.

Even when independent components are shown in a circuit diagram as if they are electrically connected to each other, one conductive film may actually function as a plurality of components at the same time; for example, wiring may partly function as an electrode or a terminal The cases described by "electrically connected" in this specification include the case where one conductive film functions as a plurality of components at the same time.

Note that in this specification, the terms "over" and "below" do not necessarily mean "directly over" and "directly below", respectively, in the description of a physical relationship between components. For example, the expression "a gate electrode over a gate insulating layer" may correspond to the situation where there is an additional component between the gate insulating layer and the gate electrode.

The position, size, and area of each component in the drawings and the like may be made different from actual ones to facilitate understanding, and thus are not necessarily limited to those in the drawings and the like in the disclosed invention.

The ordinal number such as "first", "second", and "third" are used to avoid confusion among components.

(Embodiment 1)

The following describes one embodiment of a memory circuit according to the present invention. FIG. 1A shows the structure of a memory circuit.

In FIG. 1A, a memory circuit 100 includes a transistor 101 whose off-state current is extremely low, a capacitor 102, an arithmetic circuit 221, an arithmetic circuit 222, an arithmetic circuit 223, and a switch 224. The transistor 101 is a transistor whose channel is formed in an oxide semiconductor layer as an example, and is represented by "OS". An output terminal of the arithmetic circuit 221 (represented by "out" in the figure) is electrically connected to an input terminal of the arithmetic circuit 222 (represented by "in" in the figure). The input terminal of the arithmetic circuit 222 is electrically connected to an output terminal of the arithmetic circuit 223 (represented by "out" in the figure) via the switch 224. An output terminal of the arithmetic circuit 222 (represented by "out" in the figure) is electrically connected to an input terminal of the arithmetic circuit 221 (represented by "in" in the figure). The input terminal of the arithmetic circuit 221 is electrically connected to one of a source and a drain of the transistor 101. The other of the source and the drain of the transistor 101 is electrically connected to one of a pair of electrodes of the capacitor 102 and to an input terminal of the arithmetic circuit 223 (represented by "in" in the figure). Here, one of the pair of electrodes of the capacitor 102 is referred to as "node F" (represented by "F" in the figure).

The arithmetic circuit 221 may be, for example, an inverter, a three-state buffer, a clocked inverter, a NAND circuit, or a NOR circuit. The arithmetic circuit 222 may be, for example, an inverter, a three-state buffer, a clocked inverter, a NAND circuit, or a NOR circuit. The arithmetic circuit 223 may be, for example, an inverter, a three-state buffer, a clocked inverter, a NAND circuit, or a NOR circuit. FIG. 1A shows the case where the arithmetic circuit 223 is an inverter 230. The switch may be, for example, an analog switch or a transistor. The transistor 103 may be a transistor whose channel is formed, for example, in a silicon layer or a silicon substrate.

Here, the sum of the current drive capabilities of the arithmetic circuit 223 and the switch 224 is preferably higher than the current drive capability of the arithmetic circuit 221. In the case where the current drive capability of the switch 224 is sufficiently high, the current drive capability of the arithmetic circuit 223 is preferably set higher than that of the arithmetic circuit 221. Thus, the potential of a node MB (represented by "MB" in the figure) can easily be a signal (potential) corresponding to a signal held in the capacitor 102.

In the case, for example, where the arithmetic circuit 221 is composed of an inverter and this inverter and the inverter 230 use complementary transistors, each transistor is preferably designed with the following conditions. It is preferable to satisfy the inequality $\mu1(W1/L1) > \mu2(W2/L2)$, where L1, W1, and $\mu1$ represent respectively the channel length, channel width, and mobility of a transistor which is of one conductivity type in the inverter 230, while L2, W2, and $\mu2$ represent respectively the channel length, channel width, and mobility of a transistor which is of another conductivity type in the inverter for the arithmetic circuit 221. In other words, it is preferable to satisfy the inequality $\mu1(W1/L1) > \mu2(W2/L2)$, where L1, W1, and $\mu1$ represent respectively the channel length, channel width, and mobility of an n-channel transistor in the inverter 230, while L2, W2, and $\mu2$ represent respectively the channel length, channel width, and mobility of a p-channel transistor in the inverter in the arithmetic circuit 221. Alternatively, it is preferable to satisfy the inequality μ1(W1/L1)>μ2(W2/L2), where L1, W1, and μ1 represent respectively the channel length, channel width, and mobility of a p-channel transistor in the inverter 230, while L2, W2, and μ2 represent respectively the channel length, channel width, and mobility of an n-channel transistor in the inverter in the arithmetic circuit 221. Here, "the current drive capability of the switch 224 is sufficiently high" means, for example, that when the switch 224 is composed of the transistor 103, μ3(W3/L3), where L3, W3, and μ3 represent respectively the channel length, channel width, and mobility of the transistor, is sufficiently high compared with μ2(W2/L2) or μ1(W1/L1). It is preferable to design the transistors in each circuit so that these inequalities can be satisfied when μ3(W3/L3) is sufficiently high.

A gate of the transistor 101 is electrically connected to a terminal SG1. The on or off state of the transistor 101 is selected with a control signal input to the terminal SG1. The on or off state of the switch 224 is selected with a control signal input to a terminal SG2. In FIG. 1A, the terminal SG2 is electrically connected to a gate of the transistor 103. The other of the pair of electrodes of the capacitor 102 is electrically connected to a terminal C. The terminal C may receive a fixed potential, e.g., a low supply potential.

In the case where the arithmetic circuit 221, the arithmetic circuit 222, and the arithmetic circuit 223 are transistors, the transistors may be transistors whose channel is formed in a layer or substrate composed of a semiconductor other than an oxide semiconductor. For example, the transistors may be transistors whose channel is formed in a silicon layer or a silicon substrate.

The transistor 101 may be a transistor having two gates above and below an oxide semiconductor layer. One of the gates can receive a control signal, while the other can receive another control signal. The other control signal may be a signal with a fixed potential. The fixed potential may be either a low supply potential or a high supply potential. Note that the two gates may be electrically connected to each other and receive the control signal. A signal input to the other gate can control the threshold voltage or the like of the transistor 101, further reduce the off-state current of the transistor 101, and increase the on-state current of the transistor 101.

In the memory circuit 100 in FIG. 1A, while supply voltage is supplied, the arithmetic circuit 221 and the arithmetic circuit 222 form a feedback loop and data can be held with the feedback loop. Examples of circuits that include the arithmetic circuit 221 and the arithmetic circuit 222 and hold data with a feedback loop include flip-flop circuits. The structure shown in FIG. 1A corresponds to a flip-flop circuit 201 with the following additional components: the transistor 101 whose off-state current is extremely low, the capacitor 102, the arithmetic circuit 223, and the switch 224. In FIG. 1A, these additional components are in a circuit 202.

The flip-flop circuit 201 includes a node M (represented by "M" in the figure) and the node MB. While a supply voltage is supplied, a signal at the node MB is the inverted signal of a signal at the node M. One of a source and a drain of the transistor 101 is electrically connected to the node M. The other of the source and the drain of the transistor 101 is electrically connected to one of the pair of electrodes of the capacitor 102 and to the input terminal of the arithmetic circuit 223 (represented by "in" in the figure). The output terminal of the arithmetic circuit 223 (represented by "out" in the figure) is electrically connected to the node MB via the switch 224.

Figure 1B:
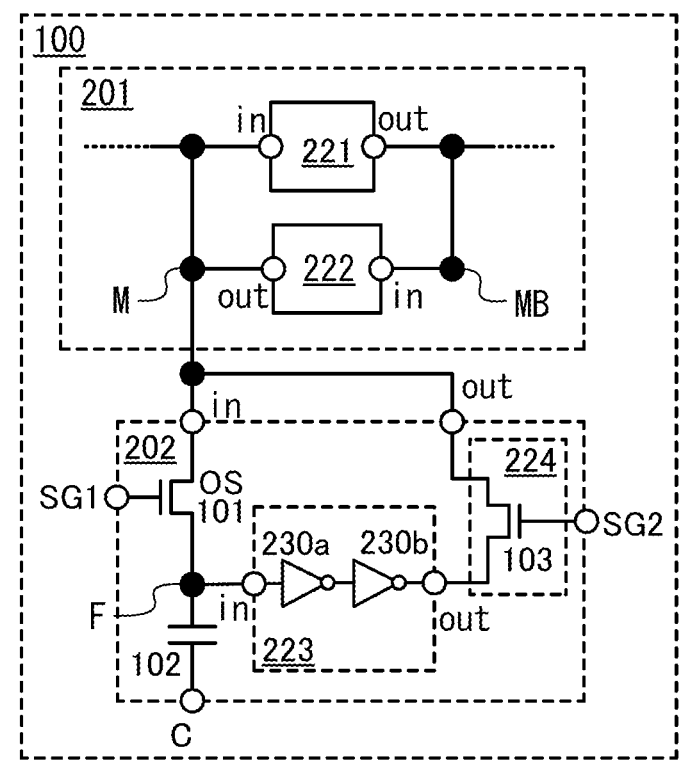

Although FIG. 1A shows a structure where the arithmetic circuit 223 is a circuit that outputs the inverted signal of an input signal and the output is input to the node MB via the switch 224, the present invention is not limited to this. A structure where the arithmetic circuit 223 is a circuit that outputs a signal without inverting an input signal and the output is input to the node M via the switch 224 as shown in FIG. 1B may be used instead. Such an arithmetic circuit 223 may have a structure, for example, where an even number of inverters are electrically connected in series. FIG. 1B shows the case where the arithmetic circuit 223 has a structure where an inverter 230a and an inverter 230b are electrically connected in series. Since the other components in FIG. 1B are the same as those in FIG. 1A, their description is omitted.

(Method for Driving Memory Circuit)

The following describes one embodiment of a method for driving the memory circuit 100 shown in FIG. 1A. In the case of the memory circuit 100, the following driving method can be used in order that after the supply of the supply voltage is started, the supply of the supply voltage can be stopped to reduce power consumption and then started again. Note that a description will be given on the assumption that the flip-flop circuit 201 inputs and outputs data in synchronism with a clock signal and an inverted clock signal. The description will be given with reference to a timing diagram of FIG. 2 and the reference numerals in FIG. 1A.

Figure 2:
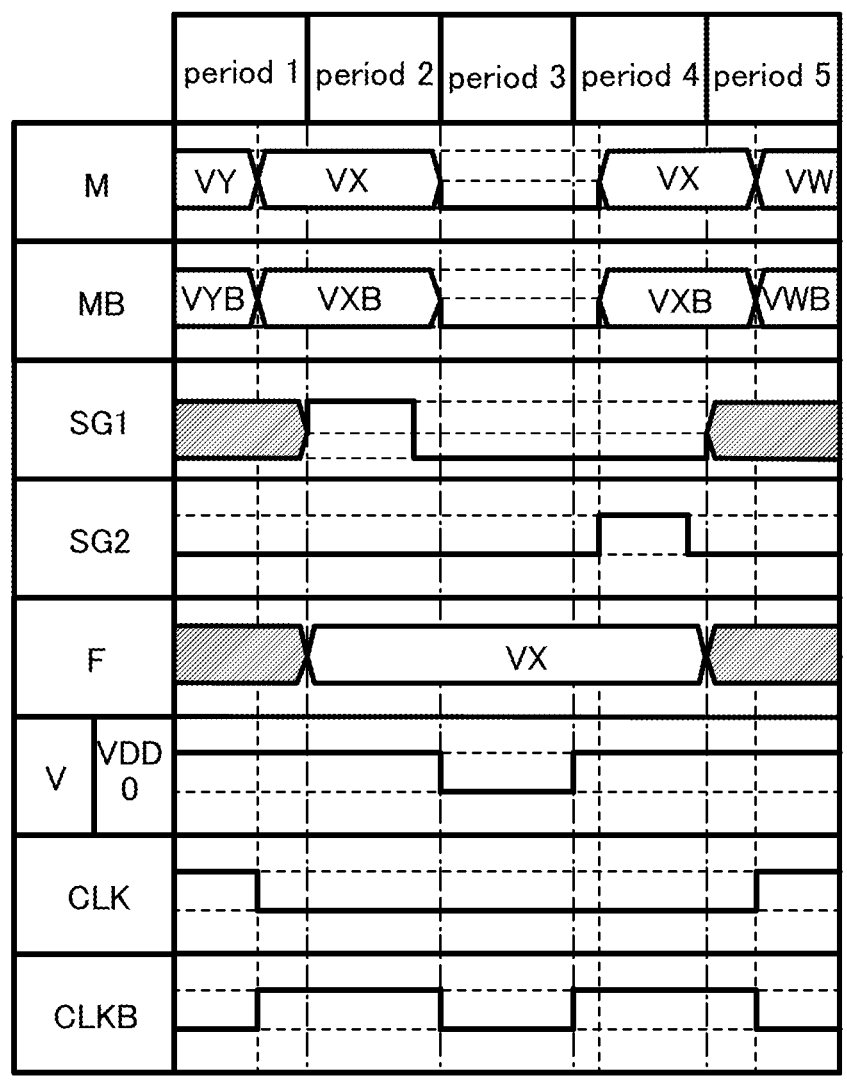
FIG. 2 is a timing diagram showing the operation of the memory circuit.

In FIG. 2, M represents the potential of the node M; MB, the potential of the node MB; F, the potential of the node F; SG1, the potential of the control signal input to the terminal SG1; SG2, the potential of the control signal input to the terminal SG2; V, the supply voltage; CLK, the potential of the clock signal; and CLKB, the potential of the inverted signal of the clock signal. In FIG. 2, a shaded portion may be any signal potential.

Although FIG. 2 shows the case where the transistor 101 is switched to the on state when SG1 is at a high level, and switched to the off state when SG1 is at a low level, the present invention is not limited to this. The potential of SG1 can be determined as appropriate so that the on and off states of the transistor 101 follow the description below. Although FIG. 2 shows the case where the transistor 103 is switched to the on state when SG2 is at a high level, and switched to the off state when SG2 is at a low level, the present invention is not limited to this. The potential of SG2 can be determined as appropriate so that the on and off states of the transistor 103 follow the description below.

(Operation during Supply of Supply Voltage)

In a period 1, VDD serving as a supply voltage V is supplied to the memory circuit 100 and the potential CLK of the clock signal and the potential CLKB of the inverted signal of the clock signal periodically change between high and low levels. At this time, in synchronism with the clock signal and the inverted signal of the clock signal, the feedback loop composed of the arithmetic circuit 221 and the arithmetic circuit 222 holds a signal corresponding to data (and its inverted signal). FIG. 2 shows the case where, at the end of the period 1, the node M holds a signal potential VX, while the node MB holds a signal potential VXB. Here, the signal potential VXB corresponds to the potential of the inverted signal of a signal corresponding to the signal potential VX. In the period 1, SG2 is at a low level, so that the switch 224 is in the off state. Thus, the memory circuit 100 holds input data in the feedback loop, and outputs the data held in the feedback loop. Here, the transistor 101 whose channel is formed in an oxide semiconductor layer has a lower mobility than a transistor whose channel is formed in a silicon layer or a silicon substrate. The presence of a transistor having a low mobility in a feedback loop decreases the data writing and reading speed of the feedback loop. In the memory circuit 100, the transistor 101 whose channel is formed in an oxide semiconductor layer is not present in the feedback loop. Thus, the feedback loop achieves high-speed data writing and reading, increasing the data writing and reading speed (operation speed) of the memory circuit 100. Note that, here, the transistor 101 whose channel is formed in an oxide semiconductor layer is preferably in the off state. If the transistor 101 is always in the on state, a signal potential corresponding to the data is input to the capacitor 102 when data is written or read to/from the feedback loop, decreasing the data writing and reading speed of the feedback loop.

(Operation before Stopping Supply of Supply Voltage)

In a period 2, the potential CLK of the clock signal and the potential of the inverted signal of the clock signal are fixed. In other words, the potential CLK of the clock signal and the potential CLKB of the inverted signal of the clock signal remain unchanged since given data is held in the feedback loop. This means that a period during which the levels (potentials) of the clock signal and the inverted signal of the clock signal, which normally change between high and low levels periodically, do not change is provided. Here, a period during which the level (potential) of the clock signal and the inverted signal of the clock signal is fixed is also called "clock signal fixed period". The period 2 corresponds to a clock signal fixed period. For this reason, in the clock signal fixed period, the node M remains at the signal potential VX, while the node MB remains at the signal potential VXB. Although FIG. 2 shows the case where the potential CLK of the clock signal is fixed at a low level, while the potential CLKB of the inverted signal of the clock signal is fixed at a high level, the present invention is not limited to this. The potential CLK of the clock signal and the potential CLKB of the inverted signal of the clock signal may be fixed at a high level and a low level, respectively. Further, in the clock signal fixed period, SG1 is changed from a high level to a low level so that the transistor 101 whose off-state current is extremely low is switched to the off state. For example, if SG1 is at a high level and the transistor 101 is in the on state immediately before the clock signal fixed period, SG1 is changed from a high level to a low level to switch the transistor 101 to the off state in the clock signal fixed period. In contrast, for example, if SG1 is at a low level and the transistor 101 is in the off state immediately before the clock signal fixed period, SG1 is changed from a low level to a high level so that the transistor 101 is temporarily switched to the on state, and SG1 is then set at a low level to switch the transistor 101 to the off state in the clock signal fixed period. Thus, the potential of the node F corresponding to one of the pair of electrodes of the capacitor 102 becomes VX. Note that it takes time for the potential of the node F to be VX after the transistor 101 is switched to the on state. In this way, a signal (potential) corresponding to data in the feedback loop is transferred to and held in the capacitor 102. Note that SG2 is at a low level, so that the switch 224 remains in the off state.

As described above, by switching the transistor 101 whose off-state current is extremely low to the off state while the levels of the clock signal and the inverted signal of the clock signal are fixed, a signal (potential) corresponding to data in the feedback loop can be transferred to and held in the capacitor 102 while fluctuations of a signal (potential) corresponding to the data are suppressed.

(Operation for Stopping Supply of Supply Voltage)

In the period 3, the supply of the supply voltage to the memory circuit 100 is stopped (the supply voltage V is forced to be zero). Consequently, in the period 3, the potentials of the node M and the node MB are any potential. Further, in the period 3, the supply of the clock signal and the inverted signal of the clock signal can be stopped. Here, "stopping the supply of the clock signal and the inverted signal of the clock signal" means "forcing the potential CLK of the clock signal and the potential CLKB of the inverted signal of the clock signal to be at the same level (e.g., a low level). By stopping the supply of the clock signal and the inverted signal of the clock signal as well as the supply of the supply voltage, power for supplying the clock signal and the inverted signal of the clock signal can also be reduced. Note that SG2 is at a low level, so that the switch 224 remains in the off state.

Here, SG1 is at a low level, so that the transistor 101 whose off-state current is extremely low remains in the off state. Consequently, a signal (potential) corresponding to data that has been held in the feedback loop is held in the capacitor 102 even after the supply of the supply voltage V to the memory circuit 100 is stopped. In other words, the potential of the node F remains VX. In this way, the use of the transistor 101 whose off-state current is extremely low allows a signal (potential) in the capacitor 102 to be held for a long period of time, so that the memory circuit 100 can hold data for a long period of time after the supply of the supply voltage is stopped. Moreover, the fatigue of the memory circuit 100 due to the repetition of data rewriting can be made insignificant, increasing the number of possible data rewriting operations.

Note that, in the memory circuit 100, while the transistor 101 whose off-state current is extremely low and the switch 224 are in the off state, one of the pair of electrodes of the capacitor 102 is electrically disconnected from each node in the feedback loop. Therefore, while the transistor 101 and the switch 224 are in the off state, the supply of the supply voltage to the memory circuit 100 and the supply of the clock signal and the inverted signal of the clock signal can be stopped at the same time, or one of these supplies can be stopped after the other is stopped. In other words, the supply of the supply voltage can be stopped in a flexible sequence.

(Operation for Restarting Supply of Supply Voltage)

In the period 4, the supply of the supply voltage to the memory circuit 100 is restarted using VDD as the supply voltage V. In addition, the clock signal and the inverted signal of the clock signal returned and fixed to the levels (potentials) at which they had been while the supply of the supply voltage had been stopped are supplied. Thus, a clock signal fixed period is started. Referring to FIG. 2, the potential CLK of the clock signal is fixed at a low level, while the potential CLKB of the inverted signal of the clock signal is fixed at a high level. Here, if the transistor 101 and the switch 224 are in the off state, the supply of the supply voltage to the memory circuit 100 and the supply of the clock signal and the inverted signal of the clock signal returned and fixed to the levels (potentials) at which they had been while the supply of the supply voltage had been stopped can be restarted at the same time, or one of these supplies can be restarted after the other is restarted. In other words, the supply of the supply voltage can be restarted in a flexible sequence.

Then, SG2 is forced to be at a high level, so that the switch 224 is switched to the on state. Note that SG1 is at a low level and the transistor 101 whose off-state current is extremely low remains in the off state. The signal (potential) held in the capacitor 102, i.e., the potential VX of the node F is converted into a corresponding signal VXB by the arithmetic circuit 223, and then, once the switch 224 is switched to the on state, input to the node MB in the feedback loop. Thus, the potential of the node MB eventually becomes VXB. Then, the potential of the node M eventually becomes VX. In this way, the data that has been held before the supply of the supply voltage is stopped is held in the feedback loop again. Subsequently, SG2 is forced to be at a low level, so that the switch 224 is switched to the off state again.

Here, the sum of the current drive capabilities of the arithmetic circuit 223 and the switch 224 is preferably higher than the current drive capability of the arithmetic circuit 221. In the case where the current drive capability of the switch 224 is sufficiently high, the current drive capability of the arithmetic circuit 223 is preferably set higher than that of the arithmetic circuit 221. Thus, the potential of a node MB can easily be a signal (potential) corresponding to a signal held in the capacitor 102.

In the case, for example, where the arithmetic circuit 221 is composed of an inverter and this inverter and the inverter 230 use complementary transistors, each transistor is preferably designed with the following conditions. It is preferable to satisfy the inequality $\mu1(W1/L1) > \mu2(W2/L2)$, where L1, W1, and $\mu1$ represent respectively the channel length, channel width, and mobility of a transistor which is of one conductivity type in the inverter 230, while L2, W2, and $\mu2$ represent respectively the channel length, channel width, and mobility of a transistor which is of another conductivity type in the inverter for the arithmetic circuit 221. In other words, it is preferable to satisfy the inequality $\mu1(W1/L1) > \mu2(W2/L2)$, where L1, W1, and $\mu1$ represent respectively the channel length, channel width, and mobility of an n-channel transistor in the inverter 230, while L2, W2, and $\mu2$ represent respectively the channel length, channel width, and mobility of a p-channel transistor in the inverter in the arithmetic circuit 221. Alternatively, it is preferable to satisfy the inequality $\mu1(W1/L1) > \mu2(W2/L2)$, where L1, W1, and $\mu1$ represent respectively the channel length, channel width, and mobility of a p-channel transistor in the inverter 230, while L2, W2, and $\mu2$ represent respectively the channel length, channel width, and mobility of an n-channel transistor in the inverter in the arithmetic circuit 221. Here, "the current drive capability of the switch 224 is sufficiently high" means, for example, that when the switch 224 is composed of the transistor 103, $\mu3(W3/L3)$, where L3, W3, and $\mu3$ represent respectively the channel length, channel width, and mobility of the transistor, is sufficiently large compared with $\mu2(W2/L2)$ or $\mu1(W1/L1)$. It is preferable to design the transistors in each circuit so that these inequalities can be satisfied when $\mu3(W3/L3)$ is sufficiently high.

In a period 5, fixing of the level (potential) of the clock signal and the inverted signal of the clock signal is stopped. In other words, the clock signal and the inverted signal of the clock signal are returned to the normal state where their levels (potentials) periodically change between high and low levels. In this way, in the memory circuit, data writing and reading in the feedback loop can be restarted. The subsequent operation is similar to "Operation during Supply of Supply Voltage".

As described above, a path for transferring and writing data held in the feedback loop to the capacitor 102 (data saving path) and a path for returning the data held in the capacitor 102 to the feedback loop (data returning path) are separate. The use of an element with high mobility as the switch 224 placed on the data returning path enables "Operation for Restarting Supply of Supply Voltage" to be conducted at higher speed. For example, the use of a transistor whose channel is formed in a silicon layer or a silicon substrate as the transistor 103 enables "Operation for Restarting Supply of Supply Voltage" to be conducted at higher speed.

The circuit 202 in FIG. 1A can be called "nonvolatile memory circuit" because, as described above, it receives data, which is held in the flip-flop circuit 201 during the supply voltage is supplied, at an input terminal (represented by "in" in the figure) and holds this data even while the supply voltage is not supplied. Then, once the supply voltage is supplied, the circuit 202 transmits (a signal corresponding to) this data to the flip-flop circuit 201 from an output terminal (represented by "out" in the figure). The fatigue of the nonvolatile memory circuit due to the repetition of data rewriting is insignificant, increasing the number of possible data rewriting operations.

The foregoing has described the method for driving the memory circuit 100.

(Memory Unit and Signal Processing Circuit)

One embodiment of a memory unit according to the present invention may be a memory unit using one or more memory circuits 100. One embodiment of a signal processing circuit according to the present invention may be a signal processing circuit using the memory unit. For example, the memory circuit 100 can be used in a memory unit such as a register or cache memory included in the signal processing circuit.

Further, the signal processing circuit may include, as well as the memory unit, any logic circuit such as an arithmetic circuit which transmits and receives data to/from the memory unit. In addition, the supply of the supply voltage to the memory unit and the supply of the supply voltage to the arithmetic circuit which transmits and receives data to/from the memory unit may be stopped at the same time.

One embodiment of the signal processing circuit according to the present invention may include a CPU, a memory, and a peripheral control unit for controlling access between the memory and the CPU. The CPU, the memory, and the peripheral control unit may include the memory circuit 100. Further, the supply of the supply voltage may be stopped in the entire signal processing circuit including the CPU, the memory, and the peripheral control unit.

The use of the memory circuit 100 for the signal processing circuit prevents data from being lost by stopping the supply of the supply voltage and allows the signal processing circuit to return, in a short time after the supply of the supply voltage is restarted, to the same state as before the supply of the supply voltage is stopped. This enables the use of a normally-off driving method in which the supply voltage is supplied only when necessary, thereby dramatically reducing power consumption. Moreover, the operation speed of the signal processing circuit can be increased, which increases reliability.

This embodiment can be implemented in appropriate combination with any of the other embodiments.

(Embodiment 2)

This embodiment shows another embodiment of the memory circuit according to the present invention. The configuration of the memory circuit 100 is shown in FIG. 3.

Figure 3:
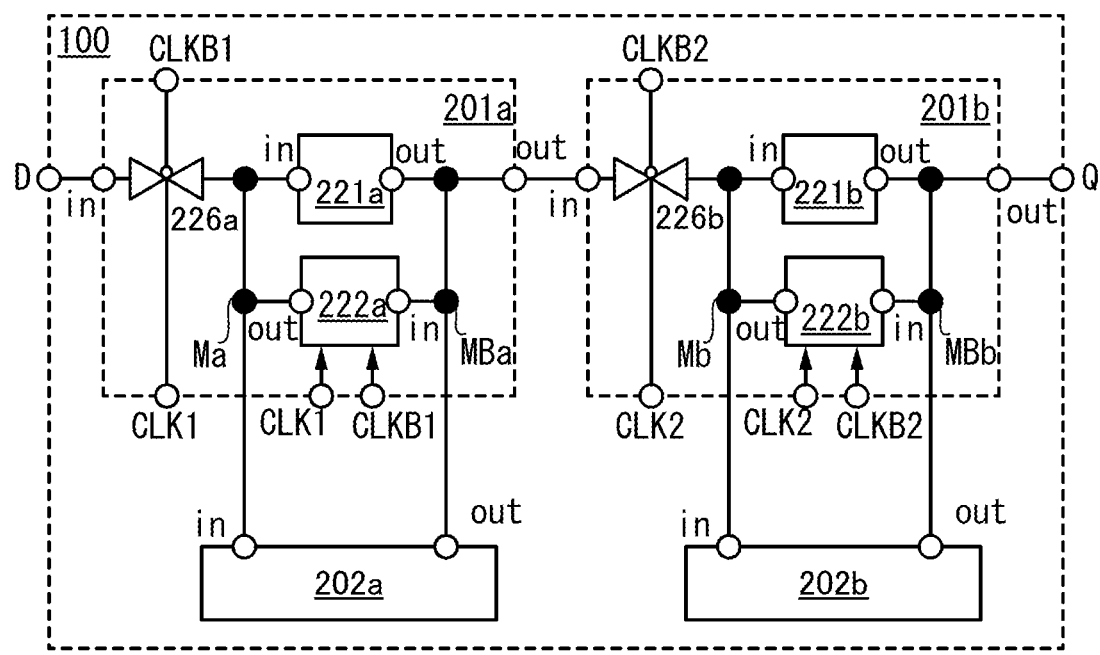
FIG. 3 is a circuit diagram of a memory circuit.

In FIG. 3, the memory circuit 100 includes a flip-flop circuit 201a, a flip-flop circuit 201b, a circuit 202a, and a circuit 202b. An output terminal of the flip-flop circuit 201a (represented by "out" in the figure) is electrically connected to an input terminal of the flip-flop circuit 201b (represented by "in" in the figure). An input terminal of the flip-flop circuit 201a (represented by "in" in the figure) serves as an input terminal D of the memory circuit 100, while an output terminal of the flip-flop circuit 201b (represented by "out" in the figure) serves as an output terminal Q of the memory circuit 100.

The circuit 202a and the circuit 202b may have the same configuration as that of the circuit 202 shown in FIG. 1A.

The flip-flop circuit 201a includes an arithmetic circuit 221a and an arithmetic circuit 222a. Electrical connections among the arithmetic circuit 221a, the arithmetic circuit 222a, and the circuit 202a may be the same as those among the arithmetic circuit 221, the arithmetic circuit 222, and the circuit 202 shown in FIG. 1A. Note that the flip-flop circuit 201a includes an analog switch 226a. The input terminal of the flip-flop circuit 201a is electrically connected to a node Ma via the analog switch 226a. The analog switch 226a and the arithmetic circuit 222a receive a clock signal CLK1 and an inverted signal CLK1B of the clock signal CLK1. Here, with the clock signal CLK1 and the inverted signal CLK1B of the clock signal CLK1, when the analog switch 226a is in the on state, the output of the arithmetic circuit 222a becomes floating, and when the analog switch 226a is in the off state, the arithmetic circuit 222a inverts an input signal and outputs the inverted signal. A node MBa is electrically connected to the output terminal of the flip-flop circuit 201a.

The flip-flop circuit 201b includes an arithmetic circuit 221b and an arithmetic circuit 222b. Electrical connections among the arithmetic circuit 221b, the arithmetic circuit 222b, and the circuit 202b may be the same as those among the arithmetic circuit 221, the arithmetic circuit 222, and the circuit 202 shown in FIG. 1A. Note that the flip-flop circuit 201b includes an analog switch 226b. The input terminal of the flip-flop circuit 201b is electrically connected to a node Mb via the analog switch 226b. The analog switch 226b and the arithmetic circuit 222b receive a clock signal CLK2 and an inverted signal CLK2B of the clock signal CLK2. Here, with the clock signal CLK2 and the inverted signal CLK2B of the clock signal CLK2, when the analog switch 226b is in the on state, the output of the arithmetic circuit 222b becomes floating, and when the analog switch 226b is in the off state, the arithmetic circuit 222b inverts an input signal and outputs the inverted signal. A node MBb is electrically connected to the output terminal of the flip-flop circuit 201b.

The clock signal CLK2 may be either the inverted signal of the clock signal CLK1 or a signal out of phase with the clock signal CLK1. In other words, the memory circuit 100 in FIG. 3 can receive either a single-phase clock signal or a two-phase clock signal. By supplying a two-phase clock, setting each of the duty cycles (the rate of a period in which a signal is at a high level in a cycle) of the clock signal CLK1 and the clock signal CLK2 to less than 50%, and providing a period in which both the clock signal CLK1 and the clock signal CLK2 are at a low level, data input to the input terminal D can be prevented from being output from the output terminal Q regardless of the clock signals (the clock signals CLK1 and CLK2). Note that the phenomenon in which the data input to the input terminal D is output from the output terminal Q regardless of the clock signals (the clock signals CLK1 and CLK2) is referred to as "data leakage" or "data racing", for example.

The description will be given of a method for driving the memory circuit 100 shown in FIG. 3 with reference to a timing diagram of FIG. 4 and the reference numerals in FIG. 1A and FIG. 3.

Figure 4:
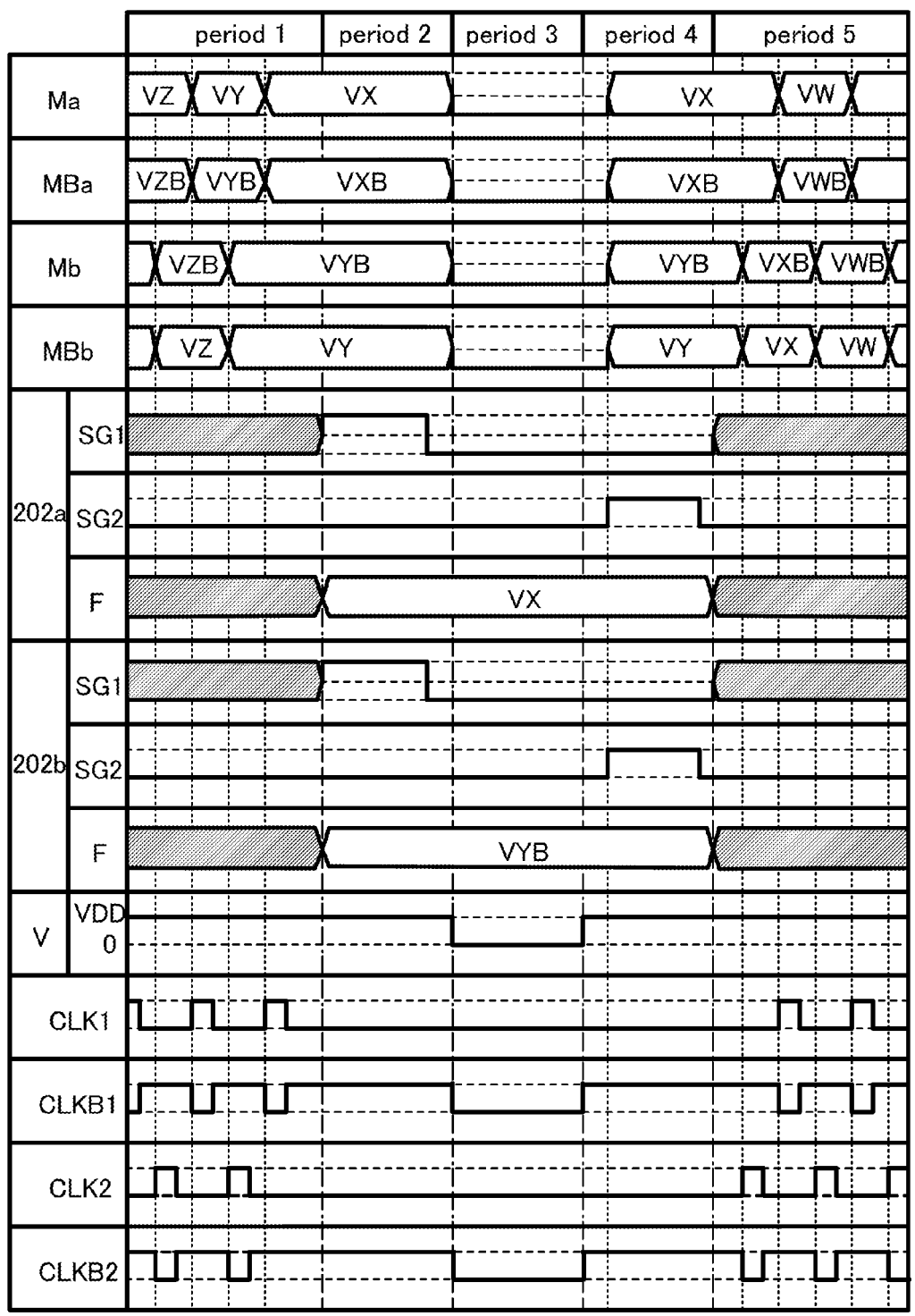
FIG. 4 is a timing diagram showing the operation of the memory circuit.

In FIG. 4, Ma represents the potential of the node Ma; MBa, the potential of the node MBa; Mb, the potential of the node Mb; MBb, the potential of the node MBb; V, the supply voltage; CLK1, the potential of the clock signal CLK1; CLKB1, the potential of the inverted signal of the clock signal CLK1; CLK2, the potential of the clock signal CLK2; CLKB2, the potential of the inverted signal of the clock signal CLK2. In the circuits 202a and 202b, F represents the potential of the node F; SG1, the potential of a control signal input to the terminal SG1; SG2, the potential of a control signal input to the terminal SG2. In FIG. 4, a shaded portion may be any signal potential.

Although FIG. 4 shows the case where the transistor 101 is switched to the on state when SG1 is at a high level, and switched to the off state when SG1 is at a low level, the present invention is not limited to this. The potential of SG1 can be determined as appropriate so that the on and off states of the transistor 101 follow the description below. Although FIG. 4 shows the case where the transistor 103 is switched to the on state when SG2 is at a high level, and switched to the off state when SG2 is at a low level, the present invention is not limited to this. The potential of SG2 can be determined as appropriate so that the on and off states of the transistor 103 follow the description below.

(Operation during Supply of Supply Voltage)

In a period 1, VDD serving as a supply voltage V is supplied to the memory circuit 100 and CLK, CLK2, CLKB1, and CLKB2 periodically change between high and low levels. Here, in the period 1 shown in FIG. 4, by setting the duty cycles (the rate of a period in which a signal is at a high level in a cycle) of the clock signal CLK1 and the clock signal CLK2 to less than 50% each and providing a period in which both the clock signal CLK1 and the clock signal CLK2 are at a low level, data input to the input terminal D is prevented from being output from the output terminal Q regardless of the clock signals (the clock signals CLK1 and CLK2).

In the period 1, in synchronism with the clock signal and the inverted signal of the clock signal, the feedback loop composed of the arithmetic circuit 221a and the arithmetic circuit 222a and the feedback loop composed of the arithmetic circuit 221b and the arithmetic circuit 222b each hold a signal corresponding to data (and its inverted signal). FIG. 4 shows the case where, at the end of the period 1, the node Ma holds a signal potential VX, the node MBa holds a signal potential VXB, the node Mb holds a signal potential VYB, and the node MBb holds a signal potential VY. Here, the signal potential VXB corresponds to the potential of the inverted signal of a signal corresponding to the signal potential VX. The signal potential VYB corresponds to the potential of the inverted signal of a signal corresponding to the signal potential VY. In the period 1, in the circuits 202a and 202b, SG2 is at a low level, so that the switch 224 is in the off state. Thus, the memory circuit 100 holds data, which has been input from the input terminal D in synchronism with the clock signals CLK1 and CLK2, in the feedback loop in the flip-flop circuit 201a, transmits the data held in the feedback loop in the flip-flop circuit 201a to the flip-flop circuit 201b, and outputs the data held in the feedback loop in the flip-flop circuit 201b from the output terminal Q. Here, the transistor 101 whose channel is formed in an oxide semiconductor layer has a lower mobility than a transistor whose channel is formed in a silicon layer or a silicon substrate. The presence of a transistor having a low mobility in a feedback loop decreases the data writing and reading speed of the feedback loop. In the memory circuit 100, the transistor 101 whose channel is formed in an oxide semiconductor layer is not present in the feedback loop. Thus, the feedback loop achieves high-speed data writing and reading, increasing the data writing and reading speed (operation speed) of the memory circuit 100. Note that, here, in each of the circuits 202a and 202b, the transistor 101 whose channel is formed in an oxide semiconductor layer is preferably in the off state. If, in each of the circuits 202a and 202b, the transistor 101 is always in the on state, a signal potential corresponding to the data is input to the capacitor 102 in each of the circuits 202a and 202b when data is written or read to/from the feedback loop. Consequently, the data writing and reading speed of each feedback loop is decreased.

(Operation before Stopping Supply of Supply Voltage)

In a period 2, CLK1, CLK2, CLKB1, and CLKB2 are fixed. In other words, CLK1, CLK2, CLKB1, and CLKB2 remain unchanged since given data is held in the feedback loops. This means that a period during which the levels (potentials) of the clock signal and the inverted signal of the clock signal, which normally change between high and low levels periodically, do not change is provided. Here, a period during which the level (potential) of the clock signal and the inverted signal of the clock signal is fixed is also called "clock signal fixed period". The period 2 corresponds to a clock signal fixed period. For this reason, in the clock signal fixed period, the node Ma remains at the signal potential VX, the node MBa remains at the signal potential VXB, the node Mb remains at the signal potential VYB, and the node MBb remains at the signal potential VY. Although FIG. 4 shows the case where CLK1 and CLK2 are fixed at a low level, while CLKB1 and CLKB2 are fixed at a high level, the present invention is not limited to this. CLK1 and CLK2 may be fixed at a high level, and CLKB1 and CLKB2 may be fixed at a low level. Further, in the clock signal fixed period, in each of the circuits 202*a* and 202*b*, SG1 is changed from a high level to a low level so that the transistor 101 whose off-state current is extremely low is switched to the off state. For example, if, in each of the circuits 202*a* and 202*b*, SG1 is at a high level and the transistor 101 is in the on state immediately before the clock signal fixed period, SG1 is changed from a high level to a low level to switch the transistor 101 to the off state in the clock signal fixed period. In contrast, for example, if, in each of the circuits 202*a* and 202*b*, SG1 is at a low level and the transistor 101 is in the off state immediately before the clock signal fixed period, SG1 is changed from a low level to a high level so that the transistor 101 is temporarily switched to the on state, and SG1 is then set at a low level to switch the transistor 101 to the off state in the clock signal fixed period. Thus, in the circuit 202*a*, the potential of the node F corresponding to one of the pair of electrodes of the capacitor 102 becomes VX, while in the circuit 202*b*, the potential of the node F corresponding to one of the pair of electrodes of the capacitor 102 becomes VYB. Note that, in each of the circuits 202*a* and 202*b*, it takes time for the potential of the node F to be such potential after the transistor 101 is switched to the on state. In this way, a signal (potential) corresponding to data in each feedback loop is transferred to and held in each capacitor 102 in the circuits 202*a* and 202*b*. Note that, in each of the circuits 202*a* and 202*b*, SG2 is at a low level, so that the switch 224 remains in the off state.

As described above, by switching the transistor 101 whose off-state current is extremely low to the off state while the levels of the clock signal and the inverted signal of the clock signal are fixed, a signal (potential) corresponding to data in each feedback loop can be transferred to and held in the capacitor 102 in each of the circuits 202*a* and 202*b* while fluctuations of a signal (potential) corresponding to the data are suppressed.

(Operation for Stopping Supply of Supply Voltage)

In the period 3, the supply of the supply voltage to the memory circuit 100 is stopped (the supply voltage V is forced to be zero). Consequently, in the period 3, the potentials of the nodes Ma, Mb, MBa, and MBb are any potential. Further, in the period 3, the supply of the clock signal and the inverted signal of the clock signal can be stopped. Here, "stopping the supply of the clock signal and the inverted signal of the clock signal" means "forcing CLK1 and CLKB1 to be at the same level (e.g., a low level), and CLK2 and CLKB2 to be at the same level (e.g., a low level). By stopping the supply of the clock signal and the inverted signal of the clock signal as well as the supply of the supply voltage, power for supplying the clock signal and the inverted signal of the clock signal can also be reduced. Note that, in each of the circuits 202*a* and 202*b*, SG2 is at a low level, so that the switch 224 remains in the off state.

Here, in each of the circuits 202*a* and 202*b*, SG1 is at a low level, so that the transistor 101 whose off-state current is extremely low remains in the off state. Consequently, a signal (potential) corresponding to data that has been held in each feedback loop is held in the capacitor 102 in each of the circuits 202*a* and 202*b* even after the supply of the supply voltage V to the memory circuit 100 is stopped. In other words, the potential of the node F in the circuit 202*a* remains VX, while the potential of the node F in the circuit 202*b* remains VYB. In this way, the use of the transistor 101 whose off-state current is extremely low allows a signal (potential) in the capacitor 102 in each of the circuits 202*a* and 202*b* to be held for a long period of time, so that the memory circuit 100 can hold data for a long period of time after the supply of the supply voltage is stopped. Moreover, the fatigue of the memory circuit 100 due to the repetition of data rewriting can be made insignificant, increasing the number of possible data rewriting operations.

Note that, in each of the circuits 202*a* and 202*b* in the memory circuit 100, while the transistor 101 whose off-state current is extremely low and the switch 224 are in the off state, one of the pair of electrodes of the capacitor 102 is electrically disconnected from each node in the feedback loop. Therefore, in each of the circuits 202*a* and 202*b*, while the transistor 101 and the switch 224 are in the off state, the supply of the supply voltage to the memory circuit 100 and the supply of the clock signal and the inverted signal of the clock signal can be stopped at the same time, or one of these supplies can be stopped after the other is stopped. In other words, the supply of the supply voltage can be stopped in a flexible sequence.

(Operation for Restarting Supply of Supply Voltage)

In the period 4, the supply of the supply voltage to the memory circuit 100 is restarted using VDD as the supply voltage V. In addition, the clock signal and the inverted signal of the clock signal returned and fixed to the levels (potentials) at which they had been while the supply of the supply voltage had been stopped are supplied. Thus, a clock signal fixed period is started. Referring to FIG. 4, CLK1 and CLK2 are fixed at a low level, while CLKB 1 and CLKB2 are fixed at a high level. Here, if, in each of the circuits 202*a* and 202*b*, the transistor 101 and the switch 224 are in the off state, the supply of the supply voltage to the memory circuit 100 and the supply of the clock signal and the inverted signal of the clock signal returned and fixed to the levels (potentials) at which they had been while the supply of the supply voltage had been stopped can be restarted at the same time, or one of these supplies can be restarted after the other is restarted. In other words, the supply of the supply voltage can be restarted in a flexible sequence.

Then, in each of the circuits 202*a* and 202*b*, SG2 is forced to be at a high level, so that the switch 224 is switched to the on state. Note that, in each of the circuits 202*a* and 202*b*, SG1 is at a low level and the transistor 101 whose off-state current is extremely low remains in the off state. In the circuit 202*a*, the signal (potential) held in the capacitor 102, i.e., the potential of the node F VX is converted into a corresponding signal VXB by the arithmetic circuit 223, and then, once the switch 224 is switched to the on state, input to the node MBa in the feedback loop. Thus, the potential of the node MBa eventually becomes VXB. Then, the potential of the node Ma eventually becomes VX. In the circuit 202*b*, the signal (potential) held in the capacitor 102, i.e., the potential of the node F VYB is converted into a corresponding signal VY by the arithmetic circuit 223, and then, once the switch 224 is switched to the on state, input to the node MBb in the feedback loop. Thus, the potential of the node MBb eventually becomes VY. Then, the potential of the node Mb eventually becomes VYB. In this way, the data that has been held before the supply of the supply voltage is stopped is held in the feedback loop again.

Subsequently, in each of the circuits 202a and 202b, SG2 is forced to be at a low level, so that the switch 224 is switched to the off state again.

In a period 5, fixing of the level (potential) of the clock signal and the inverted signal of the clock signal is stopped. In other words, the clock signal and the inverted signal of the clock signal are returned to the normal state where their levels (potentials) periodically change between high and low levels. In this way, in the memory circuit, the feedback loop can restart data writing and reading. The subsequent operation is similar to "Operation during Supply of Supply Voltage".

As described above, a path for transferring and writing data held in the feedback loop to the capacitor 102 (data saving path) and a path for returning the data held in the capacitor 102 to the feedback loop (data returning path) are separate. The use of an element with high mobility as the switch 224 placed on the data returning path enables "Operation for Restarting Supply of Supply Voltage" to be conducted at higher speed. For example, the use of a transistor whose channel is formed in a silicon layer or a silicon substrate as the transistor 103 enables "Operation for Restarting Supply of Supply Voltage" to be conducted at higher speed.

The foregoing has described the method for driving the memory circuit 100.

(Memory Unit and Signal Processing Circuit)

One embodiment of a memory unit according to the present invention may be a memory unit using one or more memory circuits 100. One embodiment of a signal processing circuit according to the present invention may be a signal processing circuit using the memory unit. For example, the memory circuit 100 can be used in a memory unit such as a register or cache memory included in the signal processing circuit.

Further, the signal processing circuit may include, as well as the memory unit, any logic circuit such as an arithmetic circuit which transmits and receives data to/from the memory unit. In addition, the supply of the supply voltage to the memory unit and the supply of the supply voltage to the arithmetic circuit which transmits and receives data to/from the memory unit may be stopped at the same time.

One embodiment of the signal processing circuit according to the present invention may include a CPU, a memory, and a peripheral control unit for controlling access between the memory and the CPU. The CPU, the memory, and the peripheral control unit may include the memory circuit 100. Further, the supply of the supply voltage may be stopped in the entire signal processing circuit including the CPU, the memory, and the peripheral control unit.

The use of the memory circuit 100 for the signal processing circuit prevents data from being lost by stopping the supply of the supply voltage and allows the signal processing circuit to return, in a short time after the supply of the supply voltage is restarted, to the same state as before the supply of the supply voltage is stopped. This enables the use of a normally-off driving method in which the supply voltage is supplied only when necessary, thereby dramatically reducing power consumption. Moreover, the operation speed of the signal processing circuit can be increased, which increases reliability.

This embodiment can be implemented in appropriate combination with any of the other embodiments.

(Embodiment 3)

A method for manufacturing the memory circuit 100 in FIGS. 1A and 1B will be described. This embodiment describes a method for manufacturing the memory circuit 100 referring to elements in the memory circuit 100: the transistor 103, the transistor 101 whose channel is formed in an oxide semiconductor layer, and the capacitor 102. Here, the case where the transistor 103 is a transistor whose channel is formed in a silicon layer is described as an example.

Figure 5A:
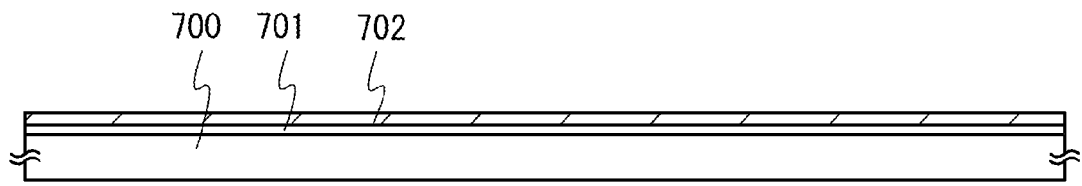
FIGS. 5A to 5D are diagrams showing a process for fabricating the memory circuit.

First, as illustrated in FIG. 5A, an insulating film 701 and a semiconductor film 702 that has been separated from a single crystal semiconductor substrate are formed over a substrate 700.

Although there is no particular limitation on a material which can be used as the substrate 700, the material needs to have at least heat resistance high enough to withstand the subsequent heat treatment. For example, a glass substrate formed by a fusion process or a float process, a quartz substrate, a semiconductor substrate, a ceramic substrate, or the like can be used as the substrate 700. In the case where the temperature for the subsequent heat treatment is high, a glass substrate whose strain point is higher than or equal to 730° C. is preferably used as the glass substrate.

In this embodiment, a method for forming the transistor 103 in which the semiconductor film 702 is formed using single crystal silicon is described below. Note that a specific example of a method for forming the single crystal semiconductor film 702 is briefly described. First, an ion beam including ions which are accelerated by an electric field enters a bond substrate which is the single crystal semiconductor substrate and an embrittlement layer which is made fragile by local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700. When the pressure is applied, bonding between the bond substrate and the insulating film 701 starts from the parts, which results in bonding of the entire surface where the bond substrate and the insulating film 701 are in close contact with each other. Subsequently, heat treatment is performed, so that microvoids that exist in the embrittlement layer are combined and the microvoids increase in volume. Consequently, a single crystal semiconductor film which is part of the bond substrate is separated from the bond substrate along the embrittlement layer. The heat treatment is performed at a temperature not exceeding the strain point of the substrate 700. Then, the single crystal semiconductor film is processed into a desired shape by etching or the like to form the semiconductor film 702.

In order to control a threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched into a predetermined shape or may be added to the semiconductor film 702 which has been etched into a predetermined shape. Alternatively, the impurity element for controlling the threshold voltage may be added to the bond substrate. Alternatively, the impurity element may be added to the bond substrate in order to roughly control the threshold voltage, and then the impurity element may be added to the semiconductor film which is not etched into a predetermined shape or the semiconductor film 702 which has been etched into a predetermined shape in order to finely control the threshold voltage.

Although this embodiment describes the case where a single crystal semiconductor film is used, the present invention is not limited thereto. For example, a polycrystalline, microcrystalline, or amorphous semiconductor film which is formed over the insulating film 701 by a vapor deposition method may be used. Alternatively, the semiconductor film may be crystallized by a known technique. Examples of known crystallization technique include laser crystallization using a laser beam, and crystallization with a catalytic element. Alternatively, crystallization with a catalytic element and laser crystallization may be combined. When a heat-resistant substrate such as a quartz substrate is used, crystallization combined with thermal crystallization with an electrically heated oven, lamp heating crystallization with infrared light, crystallization with a catalytic element, or high-temperature heating at approximately 950° C., may be used.

Figure 5B:
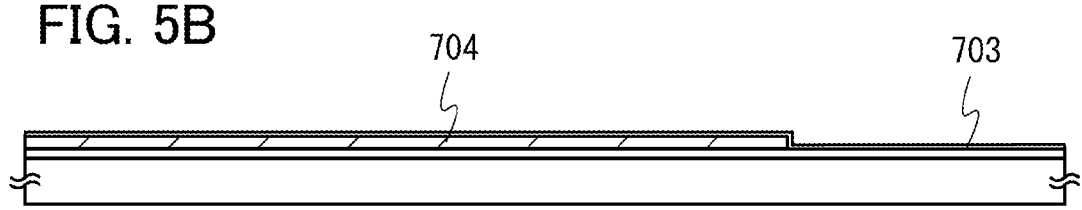

Next, as illustrated in FIG. 5B, the semiconductor film 702 is processed into a predetermined shaped, so that a semiconductor layer 704 is formed. Then, a gate insulating film 703 is formed over the semiconductor layer 704.

The gate insulating film 703 can be a single layer or a stack of layers containing silicon oxide, silicon nitride oxide, silicon oxynitride, silicon nitride, hafnium oxide, aluminum oxide, tantalum oxide, yttrium oxide, hafnium silicate (Hf-$Si_xO_y$, (x>0, y>0)), hafnium silicate (Hf$Si_xO_yN_z$(x>0, y>0, z>0)) to which nitrogen is added, hafnium aluminate (HfAl$_x$-$O_yN_z$, (x>0, y>0, z>0)) to which nitrogen is added, or the like by, for example, a plasma CVD method or a sputtering method.

Note that, in this specification, an oxynitride refers to a material containing a larger amount of oxygen than that of nitrogen, and a nitride oxide compound refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is used as the gate insulating film 703 by plasma CVD.

Figure 5C:
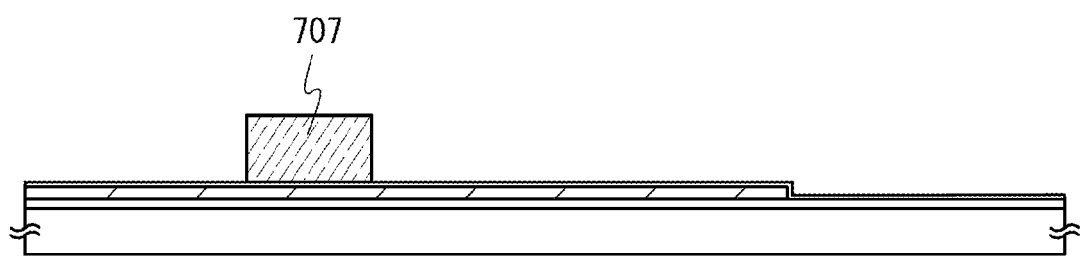

Then, a gate electrode 707 is formed as illustrated in FIG. 5C.

To form the gate electrode 707, a conductive film is formed and then is processed into a predetermined shape. The conductive film can be formed by a CVD method, a sputtering method, a vapor deposition method, a spin coating method, or the like. The conductive film is formed using tantalum (Ta), tungsten (W), titanium (Ti), molybdenum (Mo), aluminum (Al), copper (Cu), chromium (Cr), niobium (Nb), or the like. Alternatively, the conductive film may be formed using an alloy mainly containing any of these metals, or a compound containing any of these metals. Alternatively, the conductive film may be formed using a semiconductor such as polycrystalline silicon doped with an impurity element such as phosphorus which imparts conductivity to the semiconductor film.

Although the gate electrode 707 is formed using a single-layer conductive film in this embodiment, this embodiment is not limited to this structure. The gate electrode 707 may be a stack of a plurality of conductive films.

An example of the combination of two conductive films is a stack of a tantalum nitride or tantalum layer overlaid by a tungsten layer. Other examples of the combination include the combination of tungsten nitride and tungsten, the combination of molybdenum nitride and molybdenum, the combination of aluminum and tantalum, and the combination of aluminum and titanium. Since tungsten and tantalum nitride have high heat resistance, heat treatment aimed at thermal activation can be performed in the subsequent steps after forming the two conductive films. Other examples of the combination of the two conductive films include the combination of nickel silicide and silicon doped with an impurity element imparting n-type conductivity, and the combination of tungsten silicide and silicon doped with an impurity element imparting n-type conductivity.

In the case where a three-layer stack of three conductive films is used, the stack is preferably formed by a molybdenum film, an aluminum film, and a molybdenum film.

The gate electrode 707 can be a light-transmitting oxide conductive film of indium oxide, indium oxide-tin oxide, indium oxide-zinc oxide, zinc oxide, zinc aluminum oxide, zinc aluminum oxynitride, zinc gallium oxide, or the like.

Alternatively, the gate electrode 707 may be selectively formed by a droplet discharge method without a mask. A droplet discharge method refers to a method for forming a predetermined pattern by discharge or ejection of a droplet containing a predetermined composition from an orifice, and includes an inkjet method in its category.

In addition, the gate electrode 707 may be formed through the following process: a conductive film is formed and then is etched by an inductively coupled plasma (ICP) etching method under appropriately controlled conditions (e.g., the amount of electric power applied to a coiled electrode layer, the amount of electric power applied to an electrode layer on the substrate side, and the electrode temperature on the substrate side) to be tapered in a desired shape. The taper angle and the like can be adjusted also by the shape of a mask. Note that the etching gas can be, as appropriate, a chlorine-based gas such as chlorine, boron chloride, silicon chloride, or carbon tetrachloride; a fluorine-based gas such as carbon tetrafluoride, sulfur fluoride, or nitrogen fluoride; or oxygen.

Figure 5D:
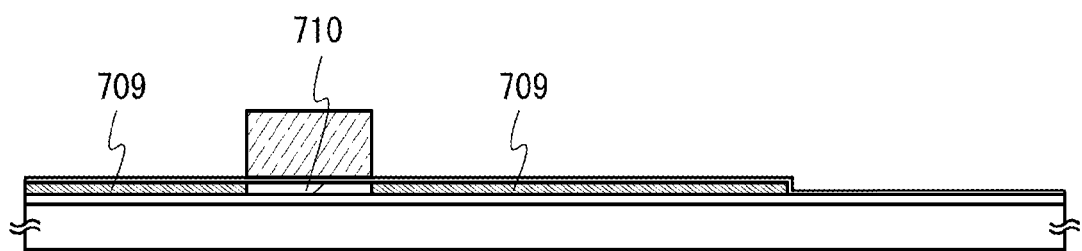

Next, as illustrated in FIG. 5D, by adding an impurity element imparting one conductivity type to the semiconductor layer 704 with the gate electrode 707 used as a mask, a channel formation region 710 overlapping with the gate electrode 707, and a pair of impurity regions 709 between which the channel formation region 710 is provided are formed in the semiconductor layer 704.

This embodiment takes the case where an impurity element imparting p-type conductivity (e.g., boron) is added to the semiconductor layer 704, as an example.

Figure 6A:
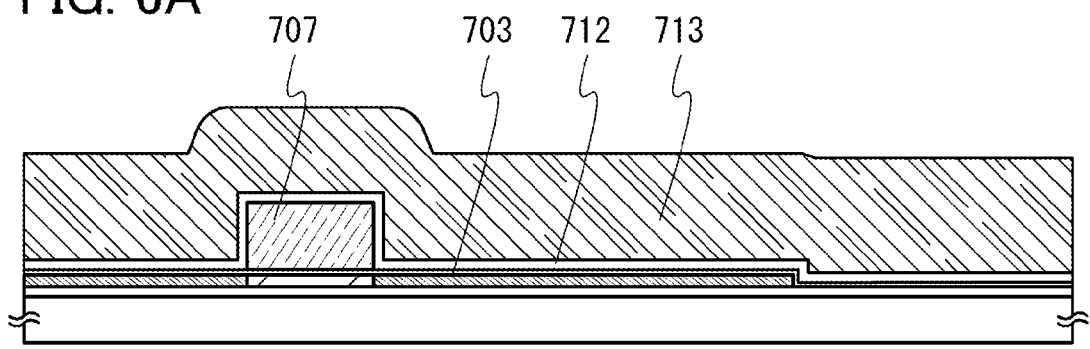
FIGS. 6A to 6C are diagrams showing a process for fabricating the memory circuit.

Next, as illustrated in FIG. 6A, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. The insulating films 712 and 713 are preferably formed using a low dielectric constant (low-k) material to sufficiently reduce capacitance due to overlapping electrodes or wires. Note that a porous insulating film containing such a material may be used as the insulating films 712 and 713. Because the porous insulating film has lower dielectric constant than a dense insulating layer, parasitic capacitance due to electrodes or wires can be further reduced.

This embodiment describes the case where silicon oxynitride is used for the insulating film 712 and silicon nitride oxide is used for the insulating film 713, as an example. Although this embodiment describes the case where the insulating films 712 and 713 are formed over the gate electrode 707 as an example, in one embodiment of the present invention, either a single insulating film or a stack of three or more insulating films may be formed over the gate electrode 707.

Figure 6B:
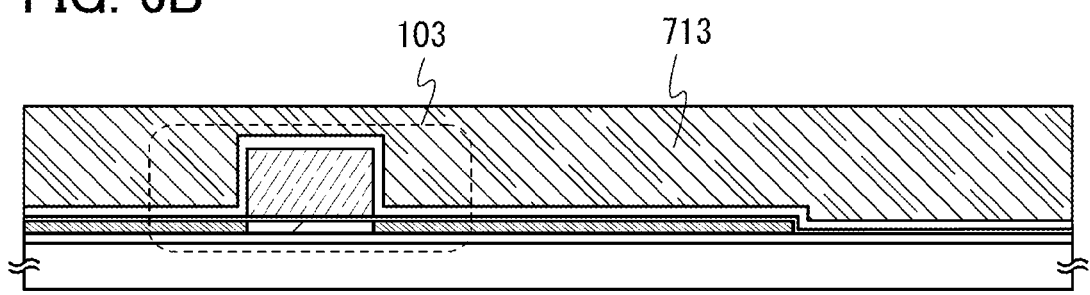

Next, as illustrated in FIG. 6B, the insulating film 713 is subjected to chemical mechanical polishing (CMP) or etching, so that a top surface of the insulating film 713 is planarized. Note that in order to improve the characteristics of the transistor 101 which is formed later, a surface of the insulating film 713 is preferably made as flat as possible.

The transistor 103 can be formed by the above process.

Figure 6C:
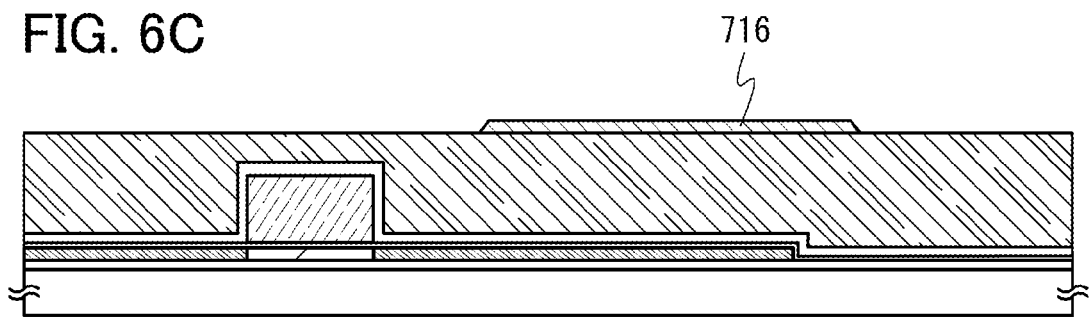

Next, a method for manufacturing the transistor 101 is described. First, as illustrated in FIG. 6C, an oxide semiconductor layer 716 is formed over the insulating film 713.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by a sputtering method using an oxide semiconductor as a target. The oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is deposited by a sputtering method, dust attached to the surface of the insulating film 713 is preferably removed by reverse sputtering in which an argon gas is introduced and plasma is generated. The reverse sputtering refers to a method in which a voltage is applied to a substrate by using an RF power source in an argon atmosphere to generate plasma in the vicinity of the substrate to modify a surface without application of voltage to a target. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

The oxide semiconductor layer includes at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide film containing indium (In), gallium (Ga), and zinc (Zn), and there is no limitation on the composition ratio thereof.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for formation of an In—Zn—O-based oxide semiconductor which has an atomic ratio of In:Zn:O=X:Y:Z, the relation of Z>1.5X+Y is satisfied.

In this embodiment, as the oxide semiconductor film, an In—Ga—Zn—O-based oxide semiconductor thin film with a thickness of 30 nm, which is obtained by a sputtering method using a target containing indium (In), gallium (Ga), and zinc (Zn), is used. The target has a composition ratio, for example, of In:Ga:Zn=1:1:0.5, In:Ga:Zn=1:1:1, or In:Ga:Zn=1:1:2. The filling rate of the target containing In, Ga, and Zn is higher than or equal to 90% and lower than or equal to 100%, preferably higher than or equal to 95% and lower than 100%. The target with high filling rate enables the deposited oxide semiconductor film to be dense.

In this embodiment, the oxide semiconductor film is formed in such a manner that the substrate is held in a treatment chamber kept at reduced pressure, a sputtering gas from which hydrogen and moisture are removed is introduced into the treatment chamber while remaining moisture therein is removed, and the above target is used. The substrate temperature may be higher than or equal to 100° C. and lower than or equal to 600° C., preferably higher than or equal to 200° C. and lower than or equal to 400° C. for the deposition. By depositing the oxide semiconductor film while heating the substrate, the concentration of impurities contained in the deposited oxide semiconductor film can be reduced. In addition, damage by sputtering can be reduced. In order to remove residual moisture in the treatment chamber, an entrapment vacuum pump is preferably used. A cryopump, an ion pump, or a titanium sublimation pump, for example, is preferably used. The evacuation unit may be a turbo pump provided with a cold trap. In the treatment chamber which is evacuated with the cryopump, for example, a hydrogen atom, a compound containing a hydrogen atom, such as water ($H_2O$), (preferably, also a compound containing a carbon atom), and the like are removed, so that the concentration of impurities contained in the oxide semiconductor film deposited in the treatment chamber can be reduced.

As one example of the deposition condition, the distance between the substrate and the target is 100 mm, the pressure is 0.6 Pa, the electric power of the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1\times10^{-10}$ Pa·m³/second, the entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive layers 719 and 720 are formed before the deposition of a gate insulating film 721.

Note that the oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal direction (vector) of the surface where the CAAC-OS film is formed or a normal direction (vector) of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering is performed before the formation of a conductive film in a subsequent step so that a resist residue and the like that attach onto surfaces of the oxide semiconductor layer 716 and the insulating film 713 are removed.

Note that the oxide semiconductor film deposited by sputtering or the like contains moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (dehydration or dehydrogenation), the oxide semiconductor layer 716 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By subjecting the island-shaped oxide semiconductor layer 716 to heat treatment, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes.

When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like are not contained in nitrogen or a rare gas such as helium, neon, or argon. Alternatively, the purity of nitrogen or a rare gas such as helium, neon, or argon which is introduced into the heat treatment apparatus is preferably greater than or equal to 6N (99.9999%), more preferably greater than or equal to 7N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI* (*SOLID STATE PHYSICS*), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes $Na^+$ when an insulating film in contact with the oxide semiconductor layer is an oxide and Na diffuses into the insulating layer. In addition, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1 \times 10^{18}$ atoms/cm$^3$, preferably less than or equal to $1 \times 10^{17}$ atoms/cm$^3$, the concentration of the above impurity is preferably reduced. Specifically, a measurement value of a Na concentration by secondary ion mass spectrometry is preferably less than or equal to $5 \times 10^{16}$ atoms/cm$^3$, more preferably less than or equal to $1 \times 10^{16}$ atoms/cm$^3$, still more preferably less than or equal to $1 \times 10^{15}$ atoms/cm$^3$. In a similar manner, a measurement value of a Li concentration is preferably less than or equal to $5 \times 10^{15}$ atoms/cm$^3$, more preferably less than or equal to $1 \times 10^{15}$ atoms/cm$^3$. In a similar manner, a measurement value of a K concentration is preferably less than or equal to $5 \times 10^{15}$ atoms/cm$^3$, more preferably less than or equal to $1 \times 10^{15}$ atoms/cm$^3$.

Through the above steps, the concentration of hydrogen in the oxide semiconductor layer 716 can be reduced and the oxide semiconductor layer can be highly purified. Thus, the oxide semiconductor layer can be stabilized. In addition, the heat treatment at a temperature of lower than or equal to the glass transition temperature makes it possible to form an oxide semiconductor layer with a wide bandgap and a very low carrier density due to hydrogen. Therefore, the transistor can be manufactured using a large-sized substrate, so that the productivity can be increased. In addition, with the purified oxide semiconductor layer in which the hydrogen concentration is reduced, a transistor with high withstand voltage and a very low off-state current can be manufactured. The above heat treatment can be performed at any time after the oxide semiconductor layer is formed.

Figure 7A:
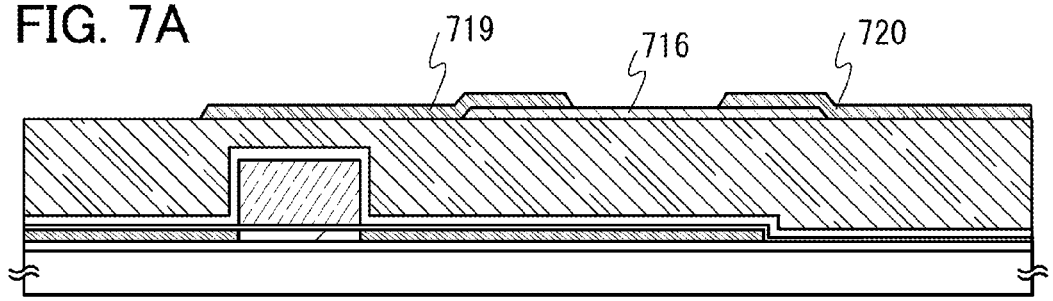
FIGS. 7A to 7D are diagrams showing a process for fabricating the memory circuit.

Then, as illustrated in FIG. 7A, the conductive layer 719 which is in contact with the oxide semiconductor layer 716, and the conductive layer 720 which is in contact with the oxide semiconductor layer 716 are formed. The conductive layers 719 and 720 function as source and drain electrodes.

Specifically, the conductive layers 719 and 720 can be formed in such a manner that a conductive film is formed by a sputtering method or a vacuum vapor deposition method and then is processed into a predetermined shape.

As the conductive film which serves as the conductive layers 719 and 720, any of the following materials can be used: an element selected from aluminum, chromium, copper, tantalum, titanium, molybdenum, or tungsten; an alloy including any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive layers 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive layers 719 and 720, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive layers 719 and 720 can be increased.

For the conductive film which serves as the conductive layers 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor layer 716 is not removed as much as possible at the time of etching the conductive film. Depending on the etching conditions, an exposed portion of the oxide semiconductor layer 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed of a multi-tone mask which is a light-exposure mask through which light is transmitted so as to have a plurality of intensities. A resist mask formed of a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, so that simplification of a process can be realized.

Further, an oxide conductive film functioning as a source region and a drain region may be provided between the oxide semiconductor layer 716 and the conductive layers 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layers 719 and 720 may be performed concurrently.

With provision of the oxide conductive film functioning as a source region and a drain region, resistance between the oxide semiconductor layer 716 and the conductive layers 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 7B:
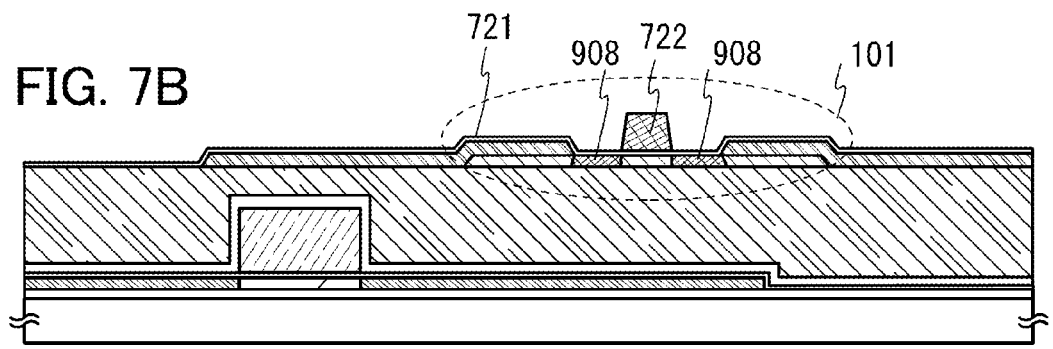

After the plasma treatment, as illustrated in FIG. 7B, the gate insulating film 721 is formed so as to cover the conductive layers 719 and 720 and the oxide semiconductor layer 716. Then, a gate electrode 722 is formed over the gate insulating film 721 so as to overlap with the oxide semiconductor layer 716.

A pair of high-concentration regions 908 is formed in such a manner that, after the gate electrode 722 is formed, a dopant imparting n-type conductivity is added to the oxide semiconductor layer 716 by using the gate electrode 722 as a mask. Note that a region of the oxide semiconductor layer 716 which overlaps with the gate electrode 722 with the gate insulating film 721 interposed therebetween is a channel formation. In the oxide semiconductor layer 716, the channel formation region is formed between the pair of high-concentration regions 908. The dopant may be added to the high-concentration regions 908 by ion implantation. The dopant is, for example, a rare gas such as helium, argon, or xenon, or a group 15 element such as nitrogen, phosphorus, arsenic, or antimony. For example, in the case where nitrogen is used as the dopant, the concentration of nitrogen atoms in the high-concentration region 908 is preferably $5 \times 10^{19}$ atoms/cm$^3$ or higher and $1 \times 10^{22}$ atoms/cm$^3$ or lower. The high-concentration region 908 to which the dopant imparting n-type conductivity is added has higher conductivity than other regions in the oxide semiconductor layer 716. Thus, with provision of the high-concentration regions 908 in the oxide semiconductor layer 716, resistance between the source and drain electrodes (the conductive layers 719 and 720) can be lowered.

By decreasing the resistance between the source and drain electrodes (the conductive layers 719 and 720), high on-state current and high-speed operation can be ensured even when the transistor 101 is miniaturized. With the miniaturization of the transistor 101, the area occupied by a memory cell array including the transistor can be reduced and the storage capacity per unit area of a memory cell array can be increased.

In the case where an In—Ga—Zn—O-based oxide semiconductor is used for the oxide semiconductor layer 716, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source and drain electrodes (the conductive layers 719 and 720) can be decreased. Note that in order to effectively decrease the resistance between the source and drain electrodes (the conductive layers 719 and 720) by forming an oxide semiconductor having a wurtzite crystal structure, in the case of using nitrogen as the dopant, the concentration of nitrogen atoms in the high-concentration regions 908 is preferably higher than or equal to $1 \times 10^{20}$ atoms/cm$^3$ and lower than or equal to 7 atoms %. However, there is also a case where an oxide semiconductor having a wurtzite crystal structure can be obtained even when the concentration of nitrogen atoms is lower than the above range.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed with a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, so that the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor layer 716 than the insulating film having a high barrier property. Then, the insulating film having a high barrier property is formed so as to overlap with the conductive layers 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a silicon nitride film with a thickness of 100 nm formed by a sputtering method is stacked over a silicon oxide film with a thickness of 200 nm formed by a sputtering method is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas is 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive layers 719 and 720 in a manner similar to that of the heat treatment performed on the oxide semiconductor film for reduction of moisture or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition can be satisfied. It is preferable that the proportion of oxygen in the oxide semiconductor layer 716 be higher than that in the stoichiometric composition. As a result, the oxide semiconductor layer 716 can be substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor layer 716 can be made to be substantially intrinsic without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like so that oxygen defects that serve as donors are reduced. For example, oxygen made to be plasma with a microwave of 2.45 GHz may be added to the oxide semiconductor layer 716.

The gate electrode 722 can be formed in such a manner that a conductive film is formed over the gate insulating film 721 and then is etched. The gate electrode 722 can be formed using the same material as that of the gate electrode 707 and the conductive layers 719 and 720.

The thickness of the gate electrode 722 is 10 nm to 400 nm, preferably 100 nm to 200 nm. In this embodiment, after a conductive film with a thickness of 150 nm for the gate electrode is formed by a sputtering method using a tungsten target, the conductive film is processed into a desired shape by etching, so that the gate electrode 722 is formed. Note that a resist mask may be formed by an inkjet method. Formation of the resist mask by an inkjet method needs no photomask; thus, manufacturing cost can be reduced.

Through the above steps, the transistor 101 is formed.

In the transistor 101, the source and drain electrodes (the conductive layers 719 and 720) do not overlap with the gate electrode 722. In other words, there is a space, which is larger than the thickness of the gate insulating film 721, between the source electrode (the conductive layer 719) and the gate electrode 722 and between the drain electrode (the conductive layer 720) and the gate electrode 722. Thus, the transistor 101 has low parasitic capacitance between the source electrode and the gate electrode and between the drain electrode and the gate electrode, thereby achieving high-speed operation.

Note that as the transistor 101, without limitation to a transistor including an oxide semiconductor layer in which a channel is formed, a transistor including, in a channel formation region, a semiconductor material whose bandgap is wider than silicon and whose intrinsic carrier density is lower than silicon can also be used. As such a semiconductor material, besides an oxide semiconductor, silicon carbide, gallium nitride, and the like can be given. With a channel formation region including such a semiconductor material, a transistor with an extremely low off-state current can be achieved.

Although the transistor 101 is described as a single-gate transistor, a multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing a Group 13 element for the insulating film in contact with the oxide semiconductor layer, an interface with the oxide semiconductor layer can keep a favorable state.

An insulating material containing a Group 13 element refers to an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor layer containing gallium, a material including gallium oxide may be used as an insulating film, so that favorable characteristics can be kept at the interface between the oxide semiconductor layer and the insulating film. When the oxide semiconductor layer and the insulating film containing gallium oxide are provided in contact with each other, pileup of hydrogen at the interface between the oxide semiconductor layer and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by an ion implantation method or an ion doping method.

For example, in the case where the insulating film which is in contact with the oxide semiconductor layer 716 is formed using gallium oxide, the composition of gallium oxide can be set to be $Ga_2O_X$ (X=3+α, 0<α<1) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ (X=3+α, 0<α<1) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+α}$ (0<X<2, 0<α<1) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be formed to an intrinsic or substantially intrinsic oxide semiconductor.

The insulating film including a region where the proportion of oxygen is higher than that in the stoichiometric composition may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films which are in contact with the oxide semiconductor layer 716. The above effect can be enhanced with a structure where the oxide semiconductor layer 716 is provided between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ (X=3+α, 0<α<1). Alternatively, one of the insulating films on the upper side and the lower side may be formed using $Ga_2O_X$ (X=3+α, 0<α<1) and the other may be formed using aluminum oxide whose composition is $Al_2O_X$ (X=3+α, 0<α<1).

The insulating film which is in contact with the oxide semiconductor layer 716 may be formed with a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ (X=3+α, 0<α<1) is formed and gallium aluminum oxide (aluminum gallium oxide) whose composition is $Ga_XAl_{2-X}O_{3+α}$ (0<X<2, 0<α<1) may be formed thereover. Note that the insulating film on the lower side of the oxide semiconductor layer 716 may be formed with a stack of insulating films each including a region where the proportion of oxygen is higher than that in the stoichiometric composition. Alternatively, both the insulating films on the upper side and the lower side of the oxide semiconductor layer 716 may be formed with a stack of insulating films each including a region where the proportion of oxygen is higher than that in the stoichiometric composition.

Figure 7C:
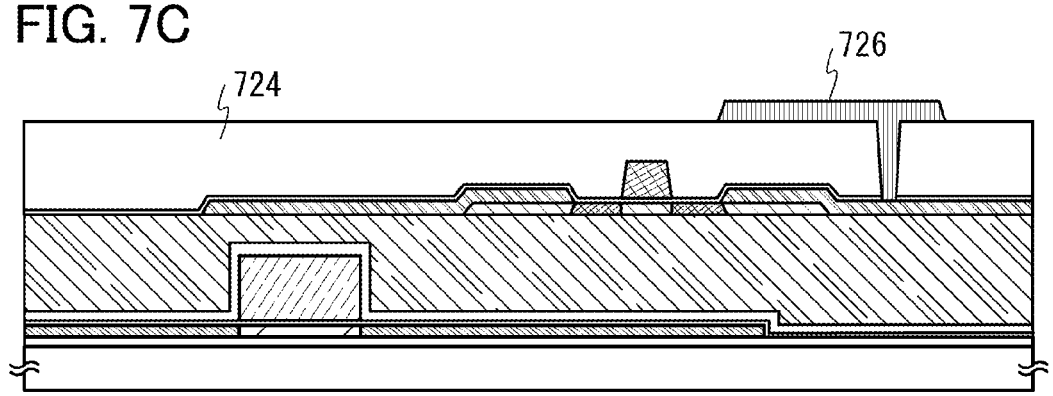

Next, as illustrated in FIG. 7C, an insulating film 724 is formed so as to cover the gate insulating film 721 and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening is formed in the gate insulating film 721 and the insulating film 724, so that part of the conductive layer 720 is exposed. After that, a wiring 726 which is in contact with the conductive layer 720 through the opening is formed over the insulating film 724.

A conductive film is formed by a PVD method or a CVD method and then is etched, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film (with a thickness of approximately 5 nm) is formed in a region including the opening of the insulating film 724 by a PVD method and then, an aluminum film is formed so as to be embedded in the opening. Here, the titanium film formed by a PVD method has a function of reducing an oxide film (e.g., a native oxide film) formed on a surface over which the titanium film is formed, to decrease the contact resistance with the lower electrode or the like (here, the conductive layer 720). In addition, hillock of aluminum film can be prevented. A copper film may be formed by a plating method after the formation of the barrier film of titanium, titanium nitride, or the like.

Figure 7D:
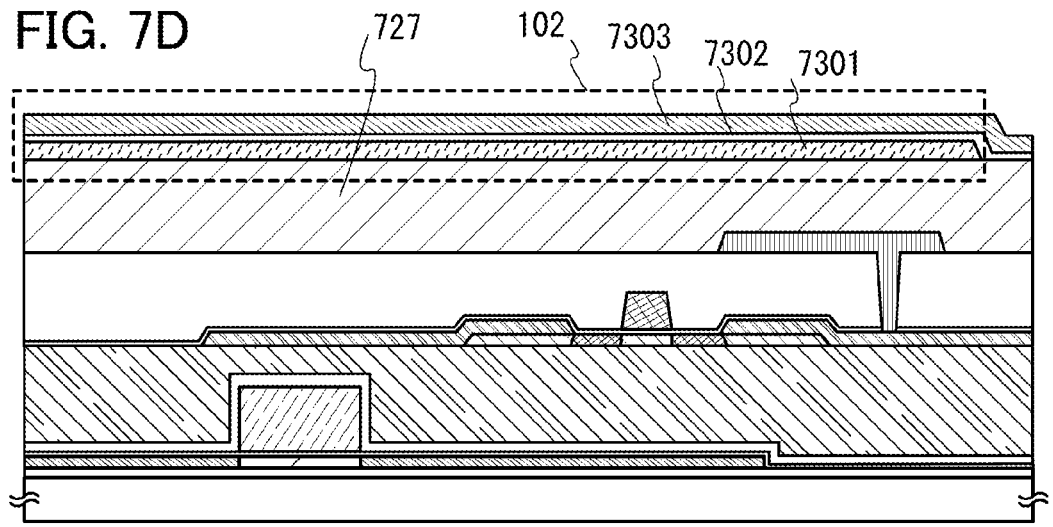

Next, an insulating film 727 is formed so as to cover the wiring 726 as shown in FIG. 7D. Further, a conductive film is formed over the insulating film 727 and is etched to form a conductive layer 7301. Subsequently, an insulating film 7302 is formed so as to cover the conductive layer 7301, and a conductive film 7303 is formed over the insulating film 7302. Thus, the capacitor 102 can be formed. One of the pair of electrodes of the capacitor 102 corresponds to the conductive layer 7301, and the other corresponds to the conductive film 7303. A dielectric layer corresponds to the insulating film 7302. Here, materials for the insulating film 727, the conductive layer 7301, the insulating film 7302, the conductive film 7303 may be the same as those for other insulating films and conductive layers.

Through the series of steps, the memory circuit 100 can be manufactured.

This embodiment can be implemented in appropriate combination with any of the other embodiments.
(Embodiment 4)

This embodiment describes a transistor that includes an oxide semiconductor layer and has a different structure from that of the transistor according to Embodiment 3. Note that the same portions as those in FIGS. 7A to 7D are denoted by the same reference numerals as those of these portions in FIGS. 7A to 7D and the description thereof is omitted.

Figure 8A:
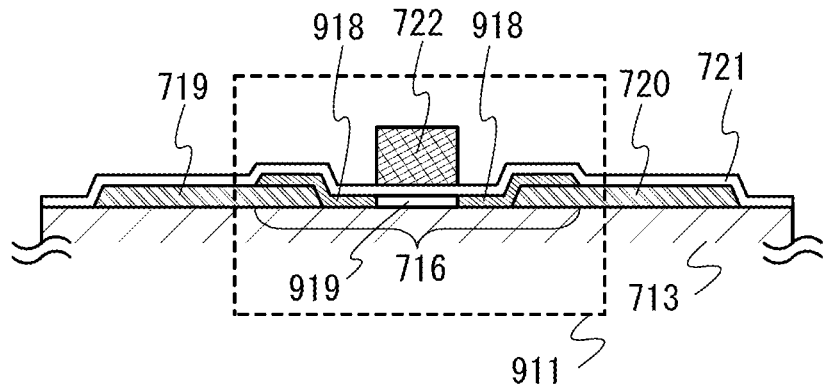
FIGS. 8A to 8C are cross-sectional views showing the structures of memory circuits.
Figure 8B:
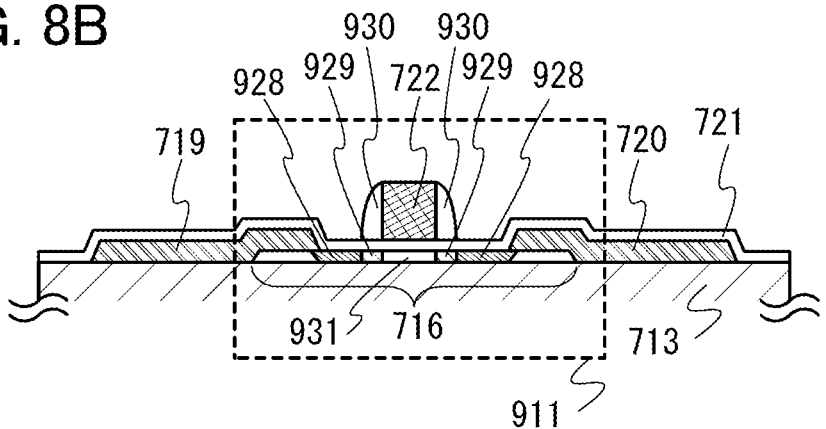

The transistor 101 illustrated in FIG. 8A is a top-gate transistor in which the gate electrode 722 is formed over the oxide semiconductor layer 716, and is also a bottom-contact transistor in which the source and drain electrodes (the conductive layers 719 and 720) are formed below the oxide semiconductor layer 716.

The oxide semiconductor layer 716 includes a pair of high-concentration regions 918 which are obtained by addition of dopant imparting n-type conductivity to the oxide semiconductor layer 716 after formation of the gate electrode 722. Further, a region of the oxide semiconductor layer 716 which overlaps with the gate electrode 722 with the gate insulating film 721 provided therebetween is a channel formation region 919. In the oxide semiconductor layer 716, the channel formation region 919 is provided between the pair of high-concentration regions 918.

The high-concentration regions 918 can be formed in the same manner as the high-concentration regions 908 described in Embodiment 4.

The transistor 101 illustrated in FIG. 8A is a top-gate transistor in which the gate electrode 722 is formed over the oxide semiconductor layer 716, and is also a top-contact transistor in which the source and drain electrodes (the conductive layers 719 and 720) are formed over the oxide semiconductor layer 716. In addition, the transistor 101 includes a sidewall 930 which is formed using an insulating film and is provided on a side surface of the gate electrode 722.

The oxide semiconductor layer 716 includes a pair of high-concentration regions 928 and a pair of low-concentration regions 929 which are obtained by addition of dopant imparting n-type conductivity to the oxide semiconductor layer 716 after formation of the gate electrode 722. Further, a region of the oxide semiconductor layer 716 which overlaps with the gate electrode 722 with the gate insulating film 721 provided therebetween is a channel formation region 931. In the oxide semiconductor layer 716, the channel formation region 931 is provided between the pair of low-concentration regions 929 which are provided between the pair of high-concentration regions 928. The pair of low-concentration regions 929 is provided in a region which is in the oxide semiconductor layer 716 and overlaps with the sidewall 930 with the gate insulating film 721 provided therebetween.

The high-concentration regions 928 and the low-concentration regions 929 can be formed in the same manner as the high-concentration regions 908 described in Embodiment 4.

Figure 8C:
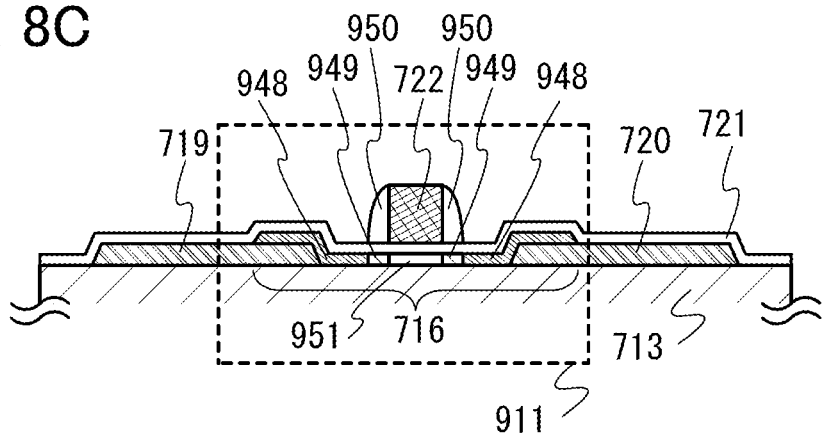

The transistor 101 illustrated in FIG. 8C is a top-gate transistor in which the gate electrode 722 is formed over the oxide semiconductor layer 716, and is also a bottom-contact transistor in which the source and drain electrodes (the conductive layers 719 and 720) are formed below the oxide semiconductor layer 716. In addition, the transistor 101 includes a sidewall 950 which is formed using an insulating film and is provided on a side surface of the gate electrode 722.

The oxide semiconductor layer 716 includes a pair of high-concentration regions 948 and a pair of low-concentration regions 949 which are obtained by addition of dopant imparting n-type conductivity to the oxide semiconductor layer 716 after formation of the gate electrode 722. Further, a region of the oxide semiconductor layer 716 which overlaps with the gate electrode 722 with the gate insulating film 721 provided therebetween is a channel formation region 951. In the oxide semiconductor layer 716, the channel formation region 951 is provided between the pair of low-concentration regions 949 which are provided between the pair of high-concentration regions 948. The pair of low-concentration regions 949 is provided in a region which is in the oxide semiconductor layer 716 and overlaps with the sidewall 950 with the gate insulating film 721 provided therebetween.

The high-concentration regions 948 and the low-concentration regions 949 can be formed in the same manner as the high-concentration regions 908 described in Embodiment 4.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications", *IEDM Tech. Dig.*, pp. 504-507, 2010).

However, in the above manufacturing method, after a gate insulating film is formed, the gate insulating film needs to be partially removed so that a portion which is to be the source region and the drain region is exposed. Therefore, at the time of removing the gate insulating film, the oxide semiconductor layer which is below the gate insulating film is partially over-etched; thus, the thickness of the portion which is to be the source region and the drain region becomes small. As a result, the resistance of the source region and the drain region is increased, and defects of transistor characteristics due to overetching easily occur.

In order to promote miniaturization of a transistor, a dry etching method with which high processing accuracy can be provided needs to be employed. However, the overetching easily occurs remarkably in the case where a dry etching method with which the selectivity of a gate insulating film to an oxide semiconductor layer is not sufficiently obtained is employed.

For example, the overetching does not become a problem as long as the oxide semiconductor layer has an enough thickness; however, when the channel length is 200 nm or less, the thickness of the oxide semiconductor layer in a region which is to be a channel formation region needs to be 20 nm or less, preferably 10 nm or less so that a short-channel effect can be prevented. When such a thin oxide semiconductor layer is used, the overetching of the oxide semiconductor layer is not preferable because the resistance of the source region and the drain region is increased and defects of transistor characteristics occur as described above.

However, as in one embodiment of the present invention, addition of dopant to an oxide semiconductor layer is performed in the state where a gate insulating film is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating film is kept clean. Therefore, the characteristics and reliability of the transistor can be improved.

This embodiment can be implemented in appropriate combination with any of the other embodiments.

(Embodiment 5)

This embodiment describes a transistor that includes an oxide semiconductor layer and has a different structure from that of the transistor according to Embodiment 3 or Embodiment 4. Note that the same portions as those in FIGS. 7A to 7D are denoted by the same reference numerals as those of these portions in FIGS. 7A to 7D and the description thereof is omitted. In the transistor 101 in this embodiment, the gate electrode 722 is provided so as to overlap with the conductive layers 719 and 720. Unlike in the transistor 101 in Embodiment 3 and Embodiment 4, an impurity element imparting a conductivity type is not added to the oxide semiconductor layer 716 by using the gate electrode 722 as a mask.

Figure 9A:
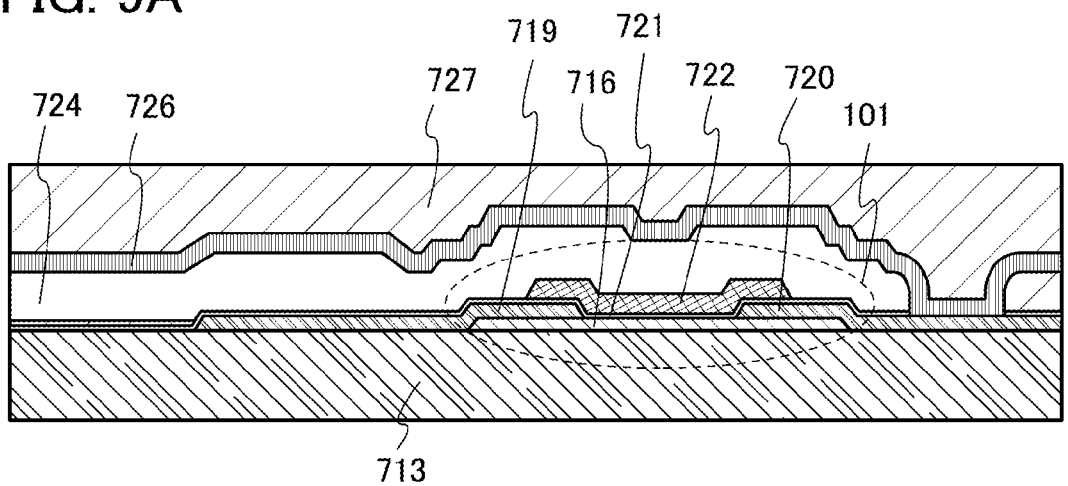
FIGS. 9A and 9B are cross-sectional views each showing the structure of a transistor whose channel is formed in an oxide semiconductor layer.
Figure 9B:
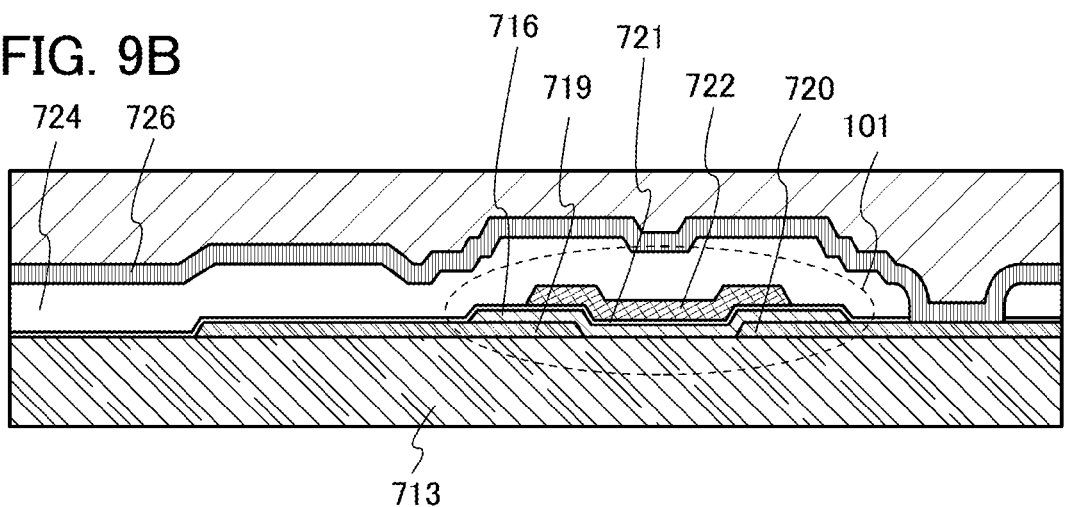

The transistor 101 shown in FIG. 9A includes the oxide semiconductor layer 716 below the conductive layers 719 and 720. The transistor 101 shown in FIG. 9B includes the oxide semiconductor layer 716 over the conductive layers 719 and 720. Although, in FIGS. 9A and 9B, a top surface of the insulating film 724 is not made flat, the present invention is not limited to this. A top surface of the insulating film 724 may be made flat.

This embodiment can be implemented in appropriate combination with any of the other embodiments.

(Embodiment 6)

A magnetic tunnel junction element (an MTJ element) is generally known as a nonvolatile random access memory. The MTJ element is put in a low resistance state when the spin directions in films provided above and below an insulating film are parallel, and put in a high resistance state when the spin directions are not parallel, thereby storing data. On the other hand, the nonvolatile memory circuit in the above embodiments utilizes a transistor whose channel is formed in an oxide semiconductor layer, and thus has a principle that is completely different from that of the MTJ element. Table 1 shows comparison between the MTJ element (indicated by "spintronics (MTJ element)" in the table) and the nonvolatile memory circuit containing an oxide semiconductor in the above embodiments (indicated by "Oxide semiconductor/Si" in the table).

TABLE 1

|  | Spintronics (MTJ element) | Oxide semiconductor/Si |
|---|---|---|
| Heat Resistance | Curie temperature | Process temperature around 500° C. (reliability at 150° C.) |
| Driving Method | Current driving | Voltage driving |
| Writing Principle | Changing spin direction of magnetic body | Turning on/off FET |
| Si LSI | Suitable for bipolar LSI (MOS LSI is preferable for high integration because bipolar LSI is unsuitable for high integration. Note that W becomes larger.) | Suitable for MOS LSI |
| Overhead | Large (because of high Joule heat) | Smaller than overhead of the MTJ element by 2 to 3 or more orders of magnitude (because of charging and discharging of parasitic capacitance) |
| Nonvolatility | Utilizing spin | Utilizing low off-state current |
| Read Number | Without limitation | Without limitation |
| 3D Conversion | Difficult (at most two layers) | Easy (the number of layers is limitless) |
| Integration Degree ($F^2$) | 4 to 15 $F^2$ | Depends on the number of layers stacked in 3D conversion (it is necessary to ensure heat resistance in process of forming upper OS FET) |
| Material | Magnetic rare-earth element | Oxide semiconductor material |

TABLE 1-continued

| | Spintronics (MTJ element) | Oxide semiconductor/Si |
|---|---|---|
| Cost per Bit | High | Low (might be slightly high depending on oxide semiconductor material (such as In)) |
| Resistance to Magnetic Field | Low | High |

The MTJ element is disadvantageous in that its magnetic properties are lost when the temperature is the Curie temperature or higher because it contains a magnetic material. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, though the MTJ element requires low write current.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that is sensitive to metal contamination. Further, the material cost per bit of the MTJ element is expensive.

On the other hand, the transistor whose channel is formed in an oxide semiconductor layer that is included in the nonvolatile memory circuit in the above embodiments has an element structure and an operation principle which are similar to those of a silicon MOSFET except that the region in which the channel is formed is composed of a metal oxide. Further, the transistor whose channel is formed in an oxide semiconductor layer is not affected by a magnetic field, and does not cause soft errors. This shows that the transistor is highly compatible with a silicon integrated circuit.

EXAMPLE 1

With the use of the signal processing circuit according to one embodiment of the present invention, an electronic device having low power consumption can be provided. In particular, in the case of a portable electronic device which has difficulty in continuously receiving power, by adding a signal processing circuit having low power consumption according to one embodiment of the present invention as a component of the device, the advantage of increased continuous operation time can be produced.

The signal processing circuit according to one embodiment of the present invention can be used for display devices, laptop personal computers, or image reproducing devices provided with recording media (typically, devices which reproduce the content of recording media such as digital versatile discs (DVDs) and have displays for displaying the reproduced images). In addition, examples of electronic devices which can use the signal processing circuit according to one embodiment of the present invention include mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines.

The following describes the case where a signal processing circuit according to one embodiment of the present invention is applied to mobile electronic devices such as a mobile phone, a smartphone, and an electronic book reader.

Figure 10:
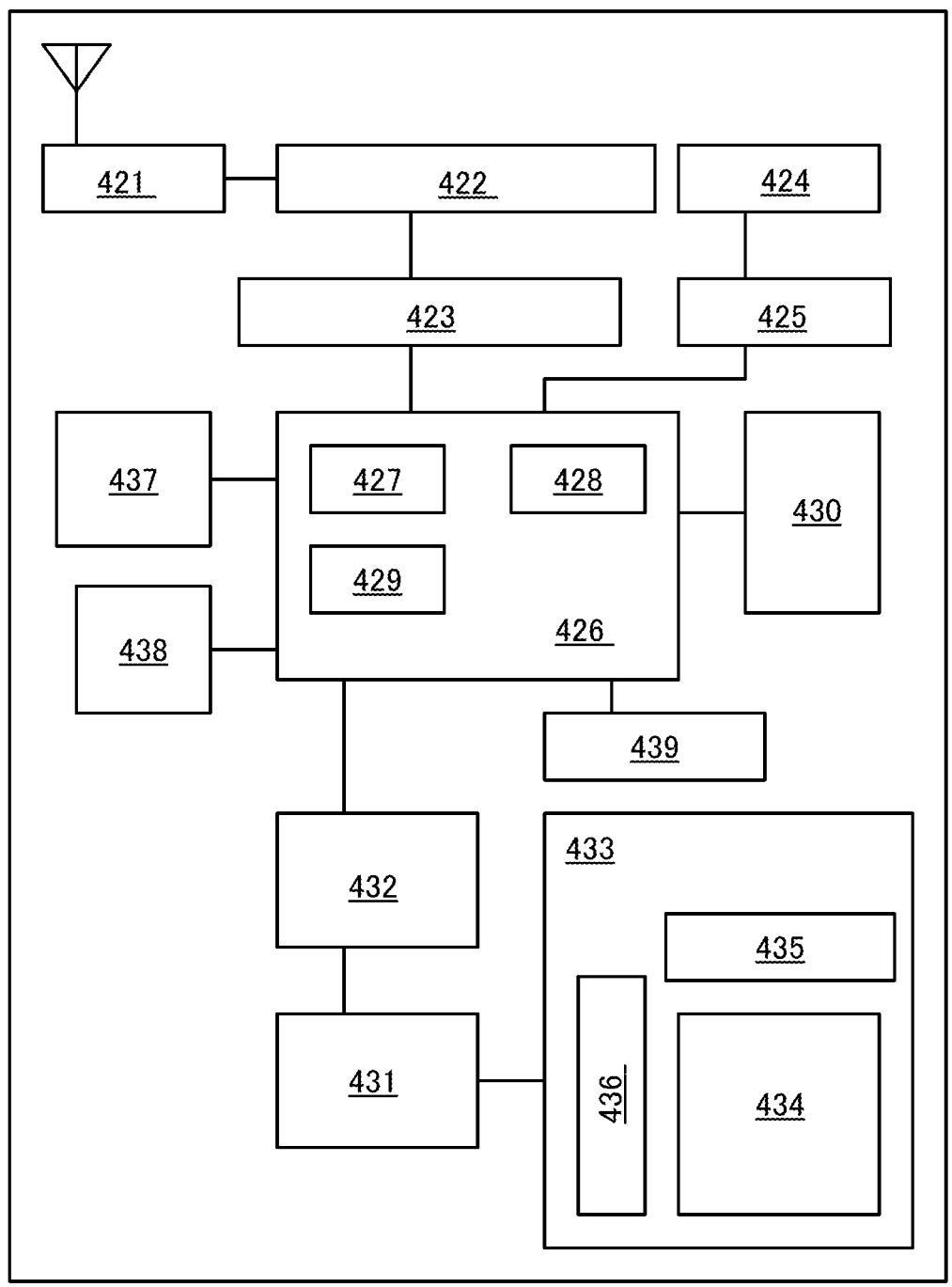
FIG. 10 is a block diagram of a portable electronic device.

FIG. 10 is a block diagram of a portable electronic device. The portable electronic device illustrated in FIG. 10 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. Power consumption can be reduced by using the signal processing circuit described in the above embodiment for any or all of the CPU 427, the digital baseband circuit 423, the memory circuit 432, the DSP 428, the interface 429, the display controller 431, and the audio circuit 437.

Figure 11:
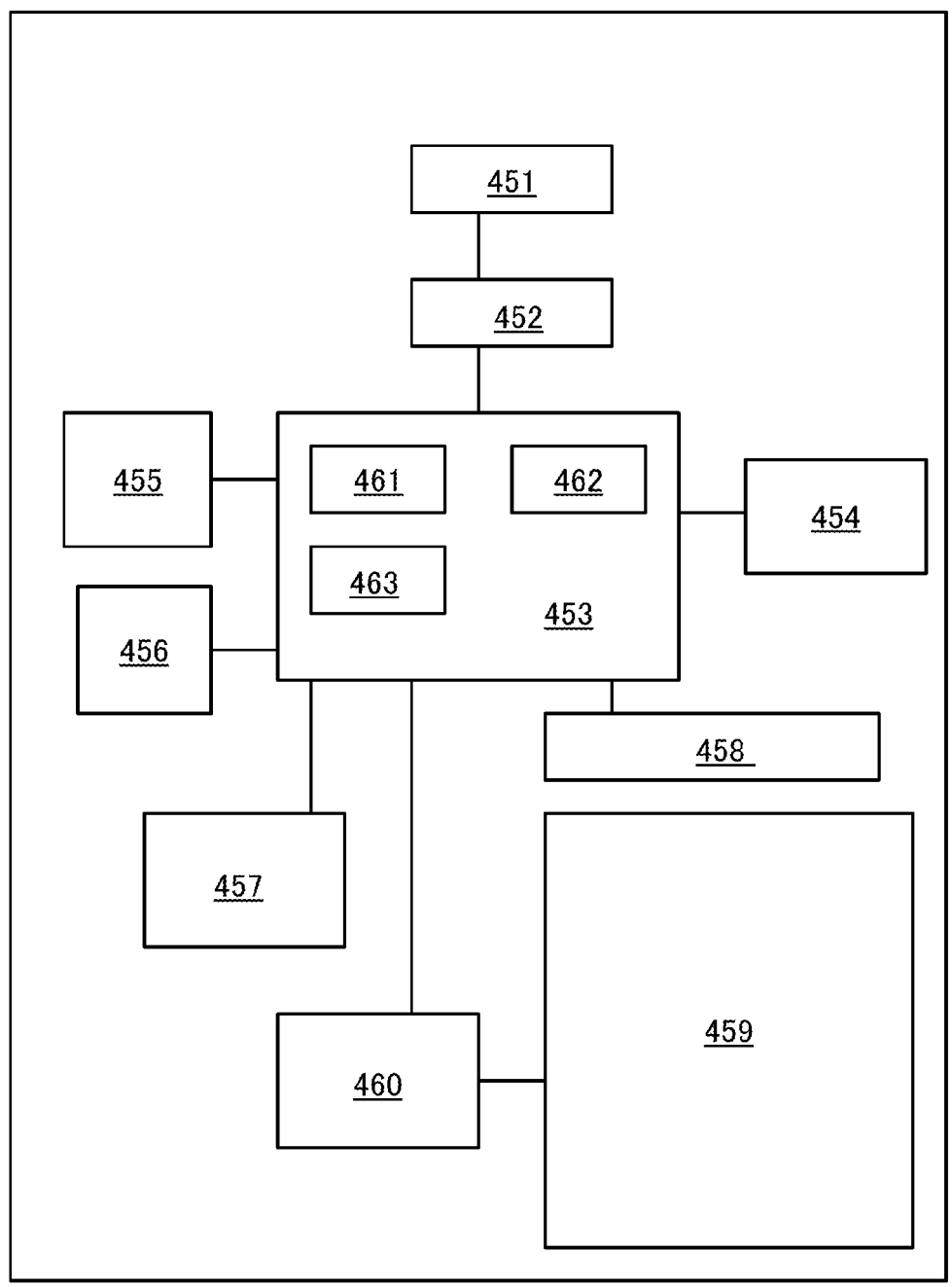
FIG. 11 is a block diagram of an e-book reader.

Next, FIG. 11 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface (IF) 463. The signal processing circuit described in the above embodiment is employed for the CPU 461 or the DSP 462, whereby power consumption can be reduced. Power consumption can be reduced by using the signal processing circuit described in the above embodiment for any or all of the CPU 461, the audio circuit 455, the memory circuit 457, the display controller 460, the DSP 462, and the interface 463.

Example 1 can be implemented in appropriate combination with any of the above embodiments.

This application is based on Japanese Patent Application Ser. No. 2011-077380 filed with Japan Patent Office on Mar. 31, 2011, the entire contents of which are hereby incorporated by reference.

What is claimed is:

1. A memory circuit comprising:
  a transistor;
  a capacitor;
  a feedback loop, the feedback loop comprising a first arithmetic circuit and a second arithmetic circuit;
  a third arithmetic circuit; and
  a switch,
  wherein an output terminal of the first arithmetic circuit is electrically connected to an input terminal of the second arithmetic circuit,
  wherein the input terminal of the second arithmetic circuit is electrically connected to an output terminal of the third arithmetic circuit via the switch, wherein an output terminal of the second arithmetic circuit is electrically connected to an input terminal of the first arithmetic circuit, wherein the input terminal of the first arithmetic circuit is electrically connected to one of a source and a drain of the transistor, wherein the other of the source and the drain of the transistor is electrically connected to one of a pair of electrodes of the capacitor and to an input terminal of the third arithmetic circuit, wherein a channel formation region of the transistor is formed in an oxide semiconductor layer, wherein the feedback loop is configured to be supplied with a clock signal and an inverted signal of the clock signal, wherein potentials of the clock signal and the inverted signal of the clock signal are fixed before a supply of a supply voltage and a supply of the clock signal and the inverted signal of the clock signal are stopped, wherein after the supply of the supply voltage and the supply of the clock signal and the inverted signal of the clock signal are stopped, the clock signal and the inverted signal of the clock signal returned and fixed to the potentials at which they had been fixed are supplied and the supply of the supply voltage is restarted, and wherein the switch is configured to be turned on after the clock signal and the inverted signal of the clock signal are supplied and the supply of the supply voltage is restarted.

2. The memory circuit according to claim 1, wherein each of the first arithmetic circuit, the second arithmetic circuit, the third arithmetic circuit and the switch comprises a transistor including a semiconductor other than an oxide semiconductor.

3. A memory unit comprising the memory circuit according to claim 1.

4. A signal processing circuit comprising:
a CPU;
a memory; and
a peripheral control unit for controlling access between the memory and the CPU,
wherein the CPU, the memory, and the peripheral control unit each include the memory circuit according to claim 1.

5. A memory circuit comprising:
a flip-flop circuit;
a transistor;
a capacitor;
an arithmetic circuit; and
a switch,
wherein the flip-flop circuit includes a first node and a second node,
wherein while a supply voltage is supplied, a signal at the second node is an inverted signal of a signal at the first node,
wherein one of a source and a drain of the transistor is electrically connected to the first node,
wherein the other of the source and the drain of the transistor is electrically connected to one of a pair of electrodes of the capacitor and to an input terminal of the arithmetic circuit, wherein an output terminal of the arithmetic circuit is electrically connected to the second node via the switch, wherein a channel formation region of the transistor is formed in an oxide semiconductor layer, wherein the flip-flop circuit is configured to be supplied with a clock signal and an inverted signal of the clock signal, wherein potentials of the clock signal and the inverted signal of the clock signal are fixed before a supply of the supply voltage and a supply of the clock signal and the inverted signal of the clock signal are stopped, wherein after the supply of the supply voltage and the supply of the clock signal and the inverted signal of the clock signal are stopped, the clock signal and the inverted signal of the clock signal returned and fixed to the potentials at which they had been fixed are supplied and the supply of the supply voltage is restarted, and wherein the switch is configured to be turned on after the clock signal and the inverted signal of the clock signal are supplied and the supply of the supply voltage is restarted.

6. The memory circuit according to claim 5, wherein each of the flip-flop circuit and the switch comprises a transistor including a semiconductor other than an oxide semiconductor.

7. A memory unit comprising the memory circuit according to claim 5.

8. A signal processing circuit comprising:
a CPU;
a memory; and
a peripheral control unit for controlling access between the memory and the CPU,
wherein the CPU, the memory, and the peripheral control unit each include the memory circuit according to claim 5.

9. The memory circuit according to claim 1, wherein the switch comprises a transistor comprising a channel formation region formed in single crystal silicon.

10. The memory circuit according to claim 5, wherein the switch comprises a transistor comprising a channel formation region formed in single crystal silicon.

11. The memory circuit according to claim 5, wherein the switch comprises a transistor having higher mobility than the transistor comprising the channel formation region in the oxide semiconductor layer.

12. The memory circuit according to claim 1, wherein the switch comprises a transistor having mobility than the transistor comprising the channel formation region in the oxide semiconductor layer.

13. The memory circuit according to claim 1, wherein each of the first arithmetic circuit, the second arithmetic circuit and the third arithmetic circuit is any one of an inverter, a three-state buffer, a clocked inverter, a NAND circuit and a NOR circuit.

14. The memory circuit according to claim 5, wherein the arithmetic circuit is any one of an inverter, a three-state buffer, a clocked inverter, a NAND circuit and a NOR circuit.

* * * * *

UNITED STATES PATENT AND TRADEMARK OFFICE
CERTIFICATE OF CORRECTION

PATENT NO. : 8,630,130 B2  
APPLICATION NO. : 13/429574  
DATED : January 14, 2014  
INVENTOR(S) : Yoshiyuki Kurokawa Page 1 of 1

It is certified that error appears in the above-identified patent and that said Letters Patent is hereby corrected as shown below:

In the Claims:

Column 42, line 49, in claim 12 before "mobility" insert --higher--.

Signed and Sealed this
First Day of July, 2014

Michelle K. Lee
*Deputy Director of the United States Patent and Trademark Office*